US007655378B2

(12) United States Patent
Hatakeyama et al.

(10) Patent No.: US 7,655,378 B2
(45) Date of Patent: Feb. 2, 2010

(54) NEGATIVE RESIST COMPOSITION AND PATTERNING PROCESS USING THE SAME

(75) Inventors: Jun Hatakeyama, Niigata (JP); Takanobu Takeda, Niigata (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 133 days.

(21) Appl. No.: 11/808,706

(22) Filed: Jun. 12, 2007

(65) Prior Publication Data

US 2008/0020290 A1 Jan. 24, 2008

(30) Foreign Application Priority Data

Jul. 24, 2006 (JP) ............................. 2006-200957

(51) Int. Cl.
*G03F 7/038* (2006.01)
*G03F 7/004* (2006.01)
*G03F 7/20* (2006.01)
*G03F 7/30* (2006.01)

(52) U.S. Cl. .................... 430/270.1; 430/325; 430/905; 430/907; 430/330

(58) Field of Classification Search ....................... None
See application file for complete search history.

(56) References Cited

U.S. PATENT DOCUMENTS

2004/0058272 A1* 3/2004 Takahashi et al. ........ 430/270.1
2007/0122740 A1* 5/2007 Hatakeyama et al. .... 430/270.1
2007/0275325 A1* 11/2007 Hatakeyama et al. .... 430/270.1

FOREIGN PATENT DOCUMENTS

WO WO 2004/074242 A2 9/2004

OTHER PUBLICATIONS

Matsuzawa, Nobuyuki N. et al., "Theoretical Calculation Of Photoabsorption Of Various Polymers In An Extreme Ultraviolet Region," J. Appl. Phys., vol. 38, Part 1, No. 12B, pp. 7109-7113, Dec. 1999.

* cited by examiner

*Primary Examiner*—Sin J. Lee
(74) *Attorney, Agent, or Firm*—Oliff & Berridge, PLC

(57) ABSTRACT

There is disclosed a negative resist composition comprising, at least, a polymer comprising a repeating unit of hydroxy vinylnaphthalene represented by the following general formula (1). There can be provided a negative resist composition, in particular, a chemically amplified negative resist composition that can exhibit higher resolution than conventional hydroxy styrene or novolac negative resist compositions, that provides excellent pattern profiles after being exposed and that exhibits excellent etching resistance; and a patterning process that uses the resist composition.

(1)

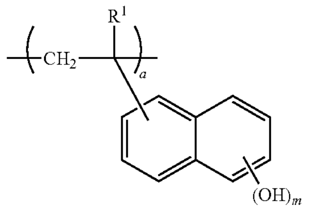

13 Claims, No Drawings

NEGATIVE RESIST COMPOSITION AND PATTERNING PROCESS USING THE SAME

BACKGROUND OF THE INVENTION

1. Field of the Invention

The present invention relates to a negative resist composition, in particular, a chemically amplified negative resist composition; and to a patterning process that uses the negative resist composition.

2. Description of the Related Art

As packing density and speed of LSIs have become higher, a finer pattern rule has been increasingly realized. In 1994, volume production of 180 nm rule devices was scheduled to start in 2001 on the SIA road map. Actually, the volume production has been pushed forward by 2 years and begun in 1999. Although ArF (193 nm) lithography was seen as a promising technique for production of 180 nm devices, KrF (248 nm) lithography has been continuously used. Then as to the 150 nm generation, even as to 130 nm generation, volume production by KrF lithography has been considered.

As KrF lithography is reaching maturity, finer dimensions have been increasingly realized. It is expected that use of ArF realizes microprocessing in 90 nm, and use of $F_2$ (157 nm) realizes microprocessing in 65 nm. Beyond this, techniques suggested as being promising are EB reduction projection exposure (PREVAIL SCALPEL) or EUV using soft X-ray as a light source.

Conventionally, polymers for resists were changed significantly every time a wavelength of light was shifted. This was done in order to secure transmittance needed. For example, in the shift from g-line to i-line, a base of sensitizers was changed from benzophenone to non-benzophenone types. The shift from i-line to KrF involved a change from novolac resins, which were used for a long period, to hydroxy styrenes. In the shift from KrF to ArF, the change of polymers is drastic and alicyclic polymers are going to be used because light cannot pass through polymers having a double bond at all. Furthermore, in $F_2$, in order to enhance transmittance further, use of alicyclic polymers to which fluorine atoms are introduced such as fluororesins has been investigated.

In using a high energy beam having an extremely short wavelength such as EB or X-rays, light elements used in resists such as hydrocarbons hardly absorb the high energy beam. Therefore, polyhydroxystyrene based resist compositions have been investigated.

Resists for EB have actually been used for mask lithography. In recent years, techniques for fabricating masks have been perceived as problems. Since the era of using g-line, reduction projection exposure systems have been used and its reduction ratio has been 1/5, and 1/4 reduction ratio has begun to be used recently along with enlargement of chip sizes and use of projection lenses having larger apertures. Not only reduction of line width due to realization of finer processings but also reduction of line width due to the change of reduction ratio are huge problems to techniques for fabricating masks.

As for exposure systems for fabricating masks, in order to enhance precision of line width, use of exposure systems using electron beams (EB) have been started instead of exposure systems using laser beams. Furthermore, still finer dimensions are achieved by increasing acceleration voltage of EB in an electron gun. Therefore, the acceleration voltage is sifted from 10 keV to 30 keV, and then use of 50 keV has been going mainstream recently.

Then as the acceleration voltage increases, a problem occurs that sensitivities of resists are deteriorated. When the acceleration voltage increases, forward scattering has less influence in resist films, the contrast of electron lithography energy is enhanced, and thus resolution and dimensional controllability are enhanced. However, electrons pass through resist films without being hampered. As a result, sensitivity of the resist is deteriorated. With a mask exposure system, exposure is conducted by direct and one time writing. Therefore, deterioration of resist sensitivity leads to decrease of productivity, and which is not preferable. To meet the demand of high sensitivity, a chemically amplified resist composition have been examined.

Accordingly, the increase of acceleration voltage and application of a chemically amplified resist exhibiting high contrast make it possible to write a dimension of 500 nm, which is 125 nm on a wafer by 1/4 reduction. However, use of KrF lithography has been extended up to device dimension of 130 nm, ArF lithography is said to be applied from 90 nm, and $F_2$ lithography is estimated to be applied from 65 nm. The limit of optical lithography using $F_2$ is estimated to be 50 nm. At this time, the dimension on a mask is 200 nm. At present, line width control of 200 nm is difficult to achieve by enhancing resolution of resists. In the case of optical lithography, use of thinner resists considerably contributes to enhancement of resolution. This is because introduction of CMP and so on have resulted in an advanced stage of planarization of devices. In the case of fabricating masks, substrates are flat, and thicknesses of substrates to be processed (for example, Cr, MoSi, or $SiO_2$) are determined for imperviousness to light and control of phase contrast. In order to use thinner resists, there is no other choice but to enhance dry etching resistance of resists.

It should be noted that it is generally believed that there is a correlation between carbon density and dry etching resistance of a resist. For EB lithography, which is not influenced by absorption, novolac polymer based resists having excellent etching resistance have been developed. However, it is difficult to control molecular weights and polydispersities of novolac polymers, and thus novolac polymers are not suitable for microprocessings.

In addition, it is reported that absorption of carbon atoms is small in soft X ray (EUV) exposure at a wavelength of 5 to 20 nm which is expected along with $F_2$ exposure as an exposure technique for microprocessings of 70 nm or beyond. It has been found that increase of carbon density not only enhances dry etching resistance but also effectively enhances transmittance in soft X ray wavelength region (see N. Matsuzawa et. al.; Jp. J. Appl. Phys. Vol. 38 p 7109-7113 (1999)).

As mentioned above, a resist composition having high carbon density, high dry etching resistance and high resolution has been demanded.

SUMMARY OF THE INVENTION

The present invention has been accomplished to solve the above-mentioned problems, and an object of the present invention is to provide a negative resist composition, in particular, a chemically amplified negative resist composition that can exhibit higher resolution than conventional hydroxy styrene or novolac negative resist compositions, that provides excellent pattern profiles after being exposed and that exhibits excellent etching resistance; and a patterning process that uses the negative resist composition.

In order to achieve the above object, the present invention provides a negative resist composition comprising, at least, a polymer comprising a repeating unit of hydroxy vinylnaphthalene represented by the following general formula (1), (1)

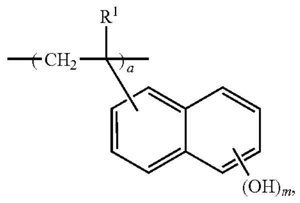

wherein $R^1$ represents a hydrogen atom or a methyl group;

m represents 1 or 2; and a satisfies $0<a\leqq1$.

In this case, the polymer preferably further comprises a repeating unit represented by the following general formula (1)-1, (1)-1

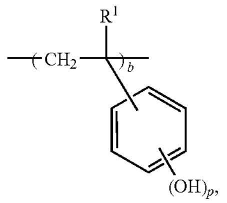

wherein $R^2$ represents a hydrogen atom or a methyl group;

p represents 1 or 2; and b satisfies $0<b<1$.

In addition, the polymer preferably further comprises a repeating unit represented by the following general formula (1)-2, (1)-2

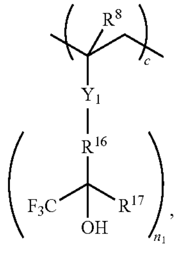

wherein $R^8$ represents a hydrogen atom, a fluorine atom, a methyl group, or a trifluoromethyl group;

$Y_1$ represents a single bond, a benzene ring, —O—, —C(=O)—O—, or —C(=O)—O—$R^{18}$—C(=O)—O—;

$R^{18}$ represents a linear, branched or cyclic alkylene group having 1-10 carbon atoms that may optionally have an alkylene group substituted with a fluorine atom or a trifluoromethyl group;

$R^{16}$ represents a single bond, or a linear, branched or cyclic alkylene group having 1-10 carbon atoms that may optionally be substituted with a fluorine atom and that may optionally have a hydroxyl group;

$R^{17}$ represents a hydrogen atom, a fluorine atom, a methyl group, a trifluoromethyl group, or a difluoromethyl group; $R^{17}$ may be linked to $R^{16}$ to form a ring, and the ring may have one or more of an ether group, an alkylene group substituted with a fluorine atom and a trifluoromethyl group;

$n_1$ represents 1 or 2; and c satisfies $0<c<1$.

In addition, the polymer preferably further comprises a repeating unit represented by the following general formula (1)-3, (1)-3

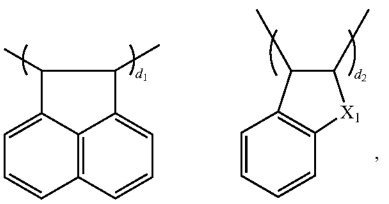

wherein $X_1$ represents any one of a methylene group, an oxygen atom, and a sulfur atom; and $d_1$ and $d_2$ satisfy $0\leqq d_1<1$, $0\leqq d_2<1$, and $0<d_1+d_2<1$.

Such a negative resist composition according to the present invention, on exposure with high energy beams, exhibits remarkably high contrast of alkali dissolution rate before and after exposure; exhibits high sensitivity and high resolution; causes less line edge roughness because swelling is reduced on development; generates less etching residue; and exhibits excellent etching resistance. Because of having such excellent advantages, the negative resist composition is extremely practical and extremely suitable as micropatterning compositions for fabricating VLSIs or forming photo mask patterns.

Furthermore, as to the hydroxy vinylnaphthalene, the hydrogen atom of the hydroxy group may be substituted with an acetyl group, an alkyl group or the like. This enables adjustment of an alkali dissolution rate of the polymer. Therefore, it is possible to obtain a negative resist composition having an appropriate alkali dissolution rate as circumstances demand.

In addition, the polymer preferably has a weight average molecular weight in the range of 1,000 to 500,000.

As mentioned above, when the polymer has a weight average molecular weight in the range of 1,000 to 500,000, the resist composition has sufficient heat resistance and alkali solubility; and less prone to cause an undercut phenomenon after being patterned.

Furthermore, the negative resist composition is preferably a chemically amplified resist composition containing an acid generator.

As mentioned above, when the negative resist composition is a chemically amplified resist composition containing an acid generator, it is possible to obtain extremely accurate patterns.

In addition, the negative resist composition preferably contains any one or more of an organic solvent, a basic compound, a dissolution inhibitor, a surfactant and a crosslinker.

As mentioned above, further addition of an organic solvent, for example, enhances application properties of the resist composition to substrates and so on; addition of a basic compound suppresses rate of acid diffusion in resist films and enhances resolution further; addition of a dissolution inhibitor increases the difference of dissolution rates between an exposed area and a non-exposed area further and enhances resolution further; addition of a surfactant makes it possible to enhance further or control application properties of the resist composition; and addition of a crosslinker enhances resolution further.

Such a negative resist composition according to the present invention may be used in accordance with a patterning process comprising: at least, a step of applying the negative resist composition to a substrate; a step of conducting a heat-treatment and then exposing the substrate to a high energy beam; and a step of developing the substrate with a developer.

In this patterning process, it is obvious that the development may be conducted after the exposure and a subsequent heat treatment, and other various processes, such as an etching process, a resist removing process or a cleaning process may be conducted.

As described above, the negative resist composition according to the present invention exhibits considerably high contrast of alkali dissolution rate before and after exposure; exhibits high sensitivity and high resolution; provides excellent pattern profiles after being exposed; in particular, suppresses rate of acid diffusion; and exhibits excellent etching resistance. Therefore, the present invention provides a negative resist composition, in particular, a chemically amplified negative resist composition particularly suitable as a micropatterning composition for fabricating VLSIs or for photo masks. Such a negative resist composition is suitably used not only for lithography in forming semiconductor circuits but also for forming mask circuit patterns, circuits of micromachines or thin film magnetic head and so on.

DESCRIPTION OF THE INVENTION AND A PREFERRED EMBODIMENT

A more thorough disclosure of the present invention is presented in the detailed description which follows. However, the present invention is not restricted thereto.

The present inventors have thoroughly investigated in order to obtain a recently demanded negative resist composition having high sensitivity, high resolution, exposure margin and so on; providing excellent etched profiles; and exhibiting excellent etching resistance.

The present inventors first aimed to increase carbon density of a resist for the purpose of enhancing etching resistance. A benzene ring has a carbon density of 92% whereas a naphthalene ring has a carbon density of 94%. Therefore, a composition containing a naphthalene ring is expected to have an enhanced dry etching resistance. Although the composition containing a naphthalene ring has not received much attention conventionally because a naphthalene ring is highly light absorptive, the inventors considered that the composition is promising in exposure using extremely short wavelengths which is not influenced by absorption.

Then the present inventors examined polymerization of hydroxy vinylnaphthalene. Use of a polymer of hydroxy vinylnaphthalene as a negative resist composition not only enhances etching resistance but also decreases critical dimension bias between dense patterns and isolated patterns by high dissolution contrast and suppression of acid diffusion. And these effects are greater than effects that hydroxy styrene provides. It is considered that this is because hydroxy vinylnaphthalene is a condensed hydrocarbon, in a polymer thereof, hydroxy groups make bonding portions rigid, thereby suppressing intramolecular thermal motions and suppressing acid diffusion.

Based on the findings mentioned above, the present inventors have found that use of a polymer obtained by polymerizing hydroxy vinylnaphthalene as a base resin of a negative resist composition, in particular, a chemically amplified negative resist composition, provides a negative resist composition, in particular, a chemically amplified negative resist composition that exhibits considerably high contrast of alkali dissolution rate before and after exposure; exhibits high sensitivity and high resolution; provides excellent pattern profiles after being exposed; exhibits excellent etching resistance; and particularly suitable as a micropatterning composition for fabricating VLSIs and for photo masks.

That is, a negative resist composition according to the present invention comprises, at least, a polymer comprising a repeating unit of hydroxy vinylnaphthalene represented by the following general formula (1), (1)

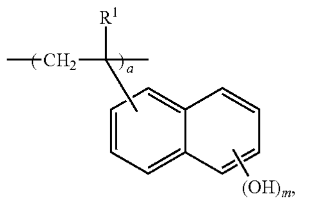

wherein $R^1$ represents a hydrogen atom or a methyl group; m represents 1 or 2; and a satisfies $0<a\leqq 1$.

The negative resist composition according to the present invention, in particular, exhibits high dissolution contrast of a resist film; exhibits high sensitivity and high resolution; has exposure margin; has excellent process applicability; provides excellent pattern profiles after being exposed, in particular, small critical dimension bias between dense patterns and isolated patterns; and exhibits more excellent etching resistance. Because of the excellent advantages mentioned above, the negative resist composition is extremely practical and extremely useful as resist compositions for VLSIs or compositions for forming mask patterns.

Furthermore, in the polymer, the hydrogen atom of the hydroxy group of the hydroxy vinylnaphthalene may be substituted with an acetyl group, an alkyl group or the like. This enables adjustment of an alkali dissolution rate of the polymer. Therefore, it is possible to obtain a negative resist composition having an appropriate alkali dissolution rate as circumstances demand.

The polymer according to the present invention indispensably comprises the repeating unit of hydroxy vinylnaphthalene. In addition, other repeating units may be copolymerized with the repeating unit of hydroxy vinylnaphthalene. Examples of the repeating units that may be copolymerized with the repeating unit of hydroxy vinylnaphthalene may include: hydroxy styrene, indene, hydroxy indene, styrene, vinylnaphthalene, vinylanthracene, vinylpyrene, indole, acenaphthylene, norbornadiene, norbornene, tricyclodecene, tetracyclododecene, methyleneindan, chromone, coumarone, (meth)acrylates having lactone, (meth)acrylic acid, 3-hydroxy adamantane (meth)acrylate, maleic anhydride, itaconic anhydride, maleimides, vinyl ethers, α-hydroxymethyl acrylates, styrene carboxylic acids, repeating units having an α-trifluoromethyl alcohol, and so on.

Among the repeating units, a repeating unit having hydroxy styrene is represented, for example, by the following general formula (1)-1.

(1)-1

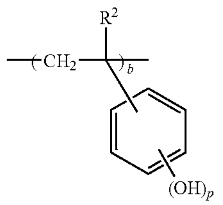

In the formula, $R^2$ represents a hydrogen atom or a methyl group;

p represents 1 or 2; and b satisfies 0<b<1.

Copolymerizing such a repeating unit of hydroxy styrene increases alkali-dissolution rate and crosslinking rate of the resulting polymer, thereby providing a resist composition exhibiting higher contrast.

Among the repeating units that may be copolymerized, a repeating unit having α-trifluoromethyl alcohol α-trifluoromethyl hydroxy group) is represented, for example, by the following general formula (1)-2.

(1)-2

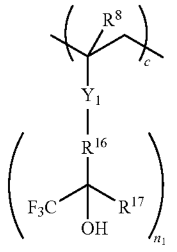

In the formula, $R^8$ represents a hydrogen atom, a fluorine atom, a methyl group, or a trifluoromethyl group;

$Y_1$ represents a single bond, a benzene ring, —O—, —C(═O)—O—, or —C(═O)—O—$R^{18}$—C(═O)—O—;

$R^{18}$ represents a linear, branched or cyclic alkylene group having 1-10 carbon atoms that may optionally have an alkylene group substituted with a fluorine atom or a trifluoromethyl group;

$R^{16}$ represents a single bond, or a linear, branched or cyclic alkylene group having 1-10 carbon atoms that may optionally be substituted with a fluorine atom and that may optionally have a hydroxyl group;

$R^{17}$ represents a hydrogen atom, a fluorine atom, a methyl group, a trifluoromethyl group, or a difluoromethyl group; $R^{17}$ may be linked to $R^{16}$ to form a ring, and the ring may have one or more of an ether group, an alkylene group substituted with a fluorine atom and a trifluoromethyl group;

$n_1$ represents 1 or 2; and c satisfies 0<c<1.

The repeating unit having α-trifluoromethyl hydroxy group represented by the general formula (1)-2 has features of preventing swelling during alkali development and preventing generation of microbridges between patterns.

Among the repeating units that may be copolymerized, a repeating unit having indene or acenaphthylene are represented, for example, by the following general formula (1)-3.

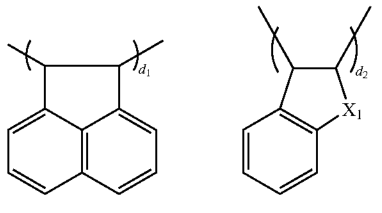

In the formula, $X_1$ represents any one of a methylene group, an oxygen atom, and a sulfur atom; and $d_1$ and $d_2$ satisfy $0 \leqq d_1 < 1$, $0 \leqq d_2 < 1$, and $0 < d_1 + d_2 < 1$.

The repeating unit having indene or acenaphthylene represented by the general formula (1)-3 has features of enhancing etching resistance, and providing an effect of increasing crosslinking efficiency due to decrease of alkali dissolution rate.

Among the repeating units that may be copolymerized, a repeating unit having α-trifluoromethyl alcohol is represented, for example, by the following general formula (2).

(2)

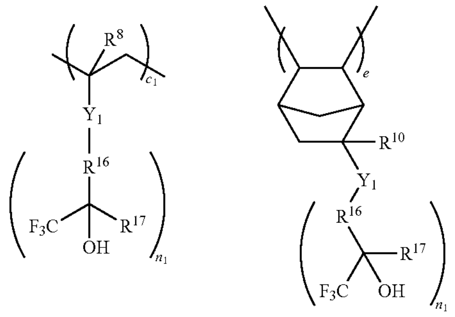

In the formula, $R^8$ and $R^{10}$ represent a hydrogen atom, a fluorine atom, a methyl group, or a trifluoromethyl group;

$Y_1$ represents a single bond, a benzene ring, —O—, —C(═O)—O—, or —C(═O)—O—$R^{18}$—C(═O)—O—;

$R^{18}$ represents a linear, branched or cyclic alkylene group having 1-10 carbon atoms that may optionally have an alkylene group substituted with a fluorine atom or a trifluoromethyl group;

$R^{16}$ represents a single bond, or a linear, branched or cyclic alkylene group having 1-10 carbon atoms that may optionally be substituted with a fluorine atom and that may optionally have a hydroxyl group;

$R^{17}$ represents a hydrogen atom, a fluorine atom, a methyl group, a trifluoromethyl group, or a difluoromethyl group; $R^{17}$ may be linked to $R^{16}$ to form a ring, and the ring may have one or more of an ether group, an alkylene group substituted with a fluorine atom and a trifluoromethyl group;

$n_1$ represents 1 or 2; and $c_1$ and e satisfy $0 \leqq c_1 < 1$, $0 \leqq e < 1$ and $0 < c_1 + e < 1$. That is, when the polymer comprises the general formula (2), the polymer comprises at least the repeating unit $c_1$ or the repeating unit e.

Examples of monomers for obtaining the repeating units having α-trifluoromethyl alcohol represented by the general formula (1)-2 and (2) are shown below. In the following formulae, $R^8$ and $R^{10}$ represent the same as above.

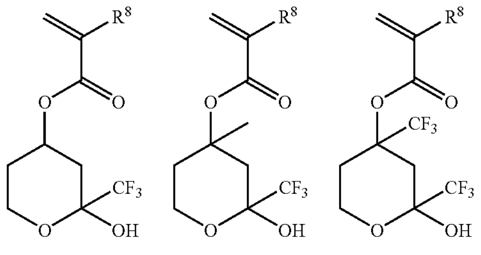

-continued
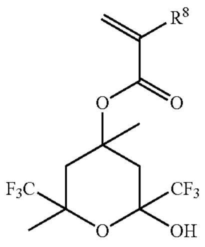
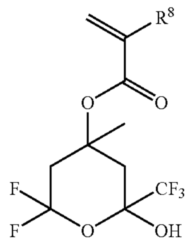
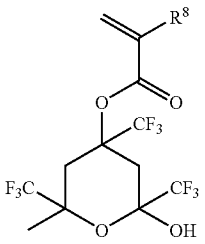
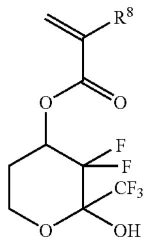
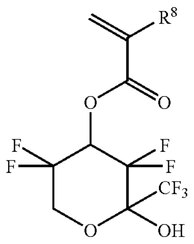
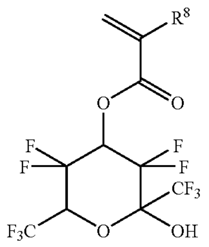
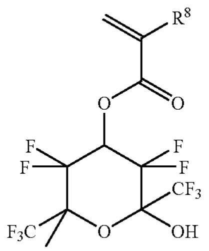
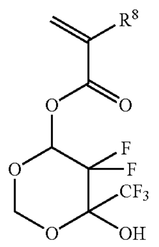
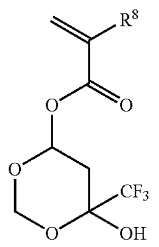
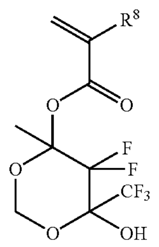
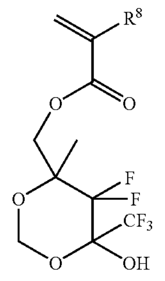
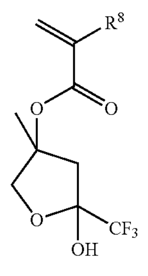
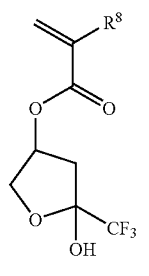
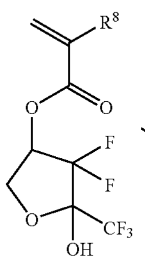
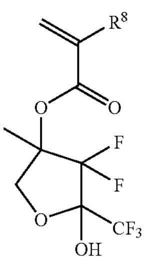
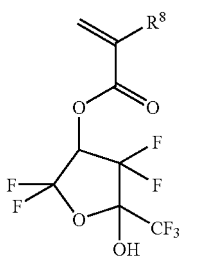
-continued
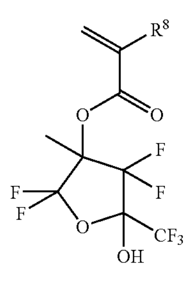
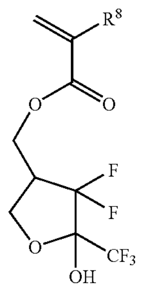
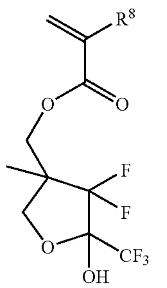
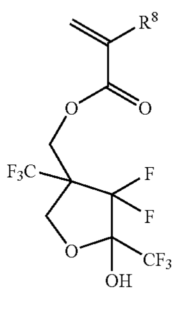
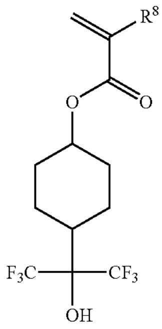
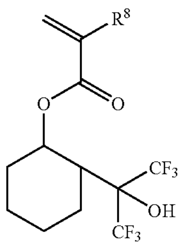
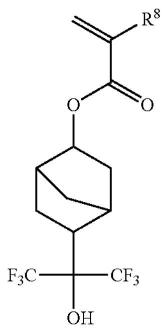
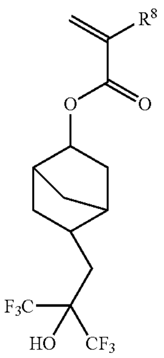
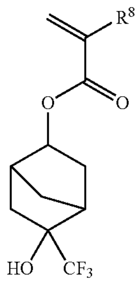
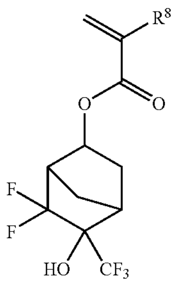
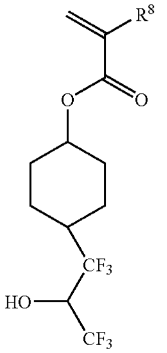
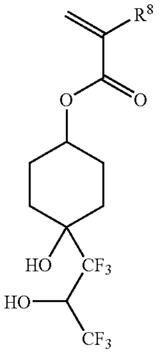
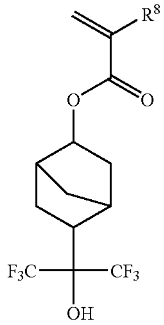
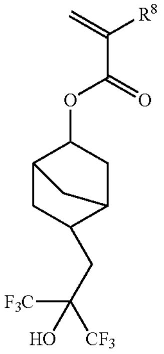
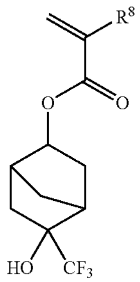

-continued
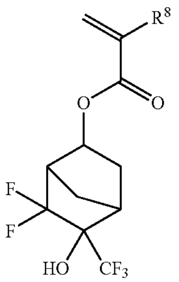
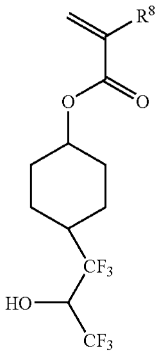
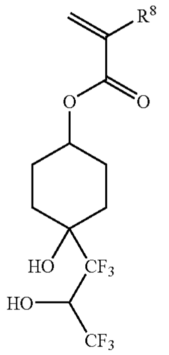
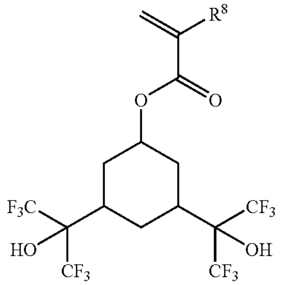
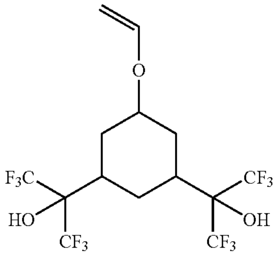
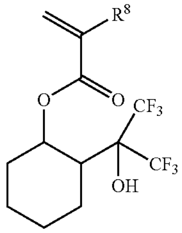
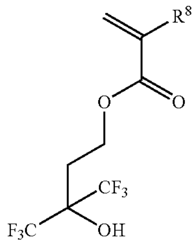
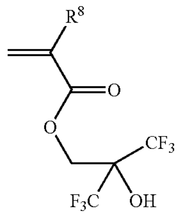
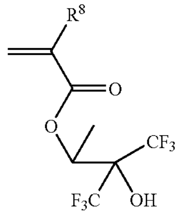
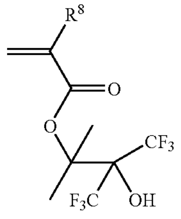
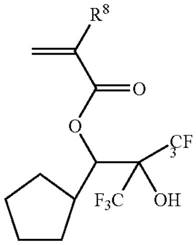
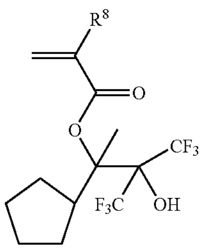
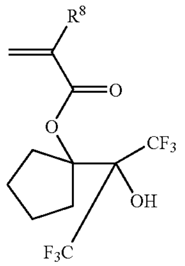
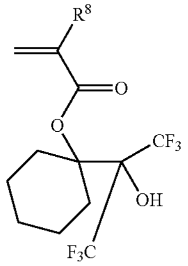
-continued
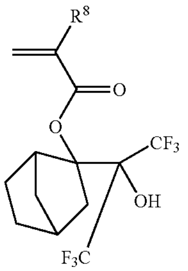
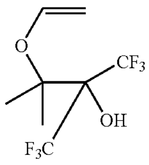
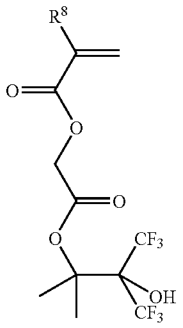
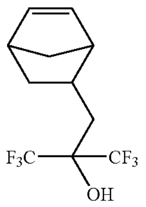
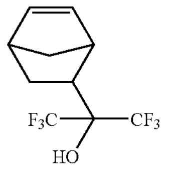
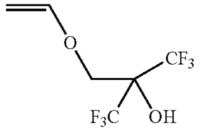
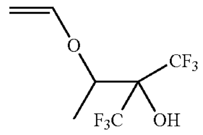
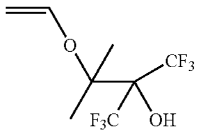
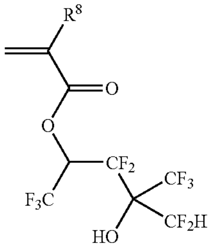
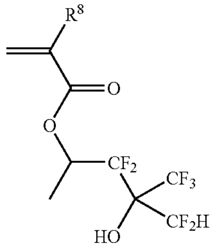
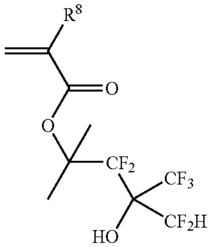
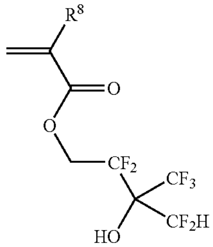
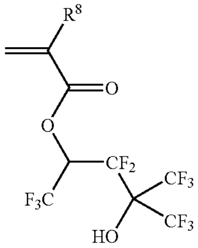
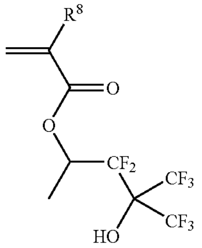
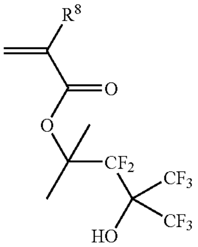
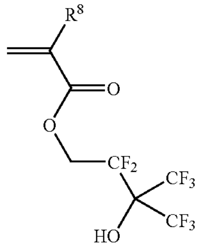

-continued
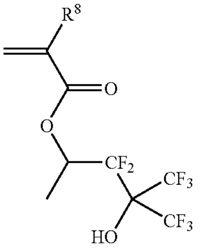
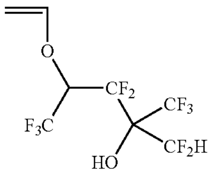
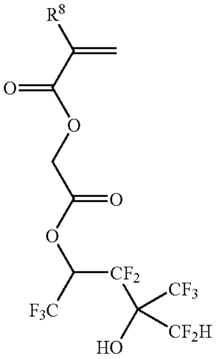
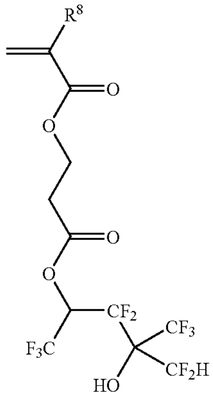
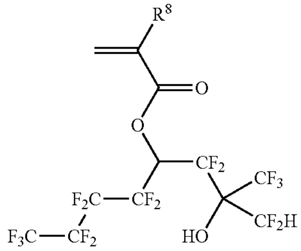
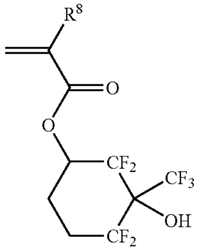
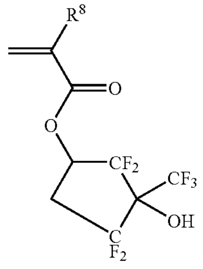
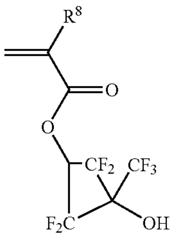
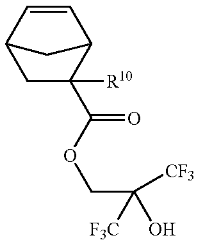
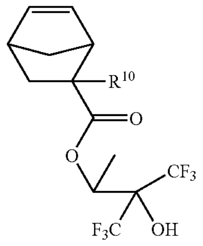
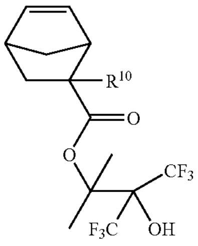
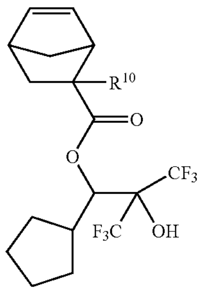
-continued
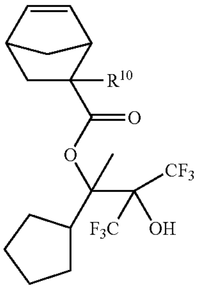
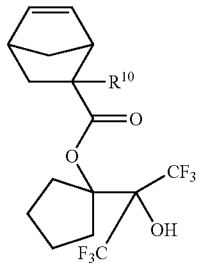
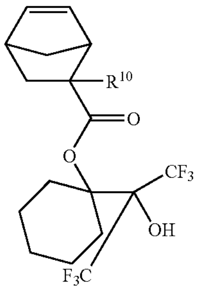
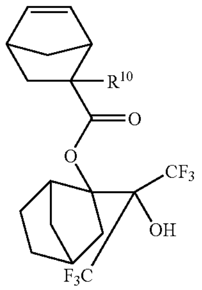
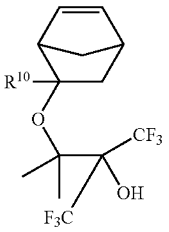
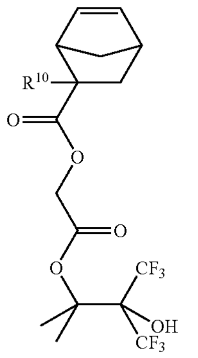
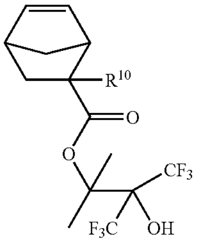
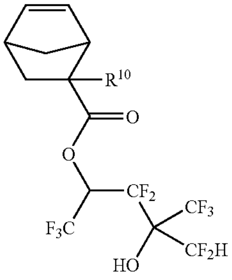
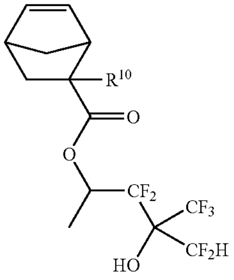
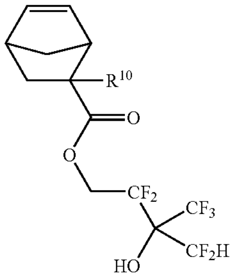
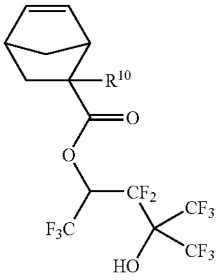

-continued

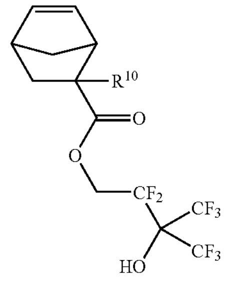
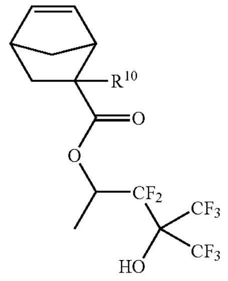
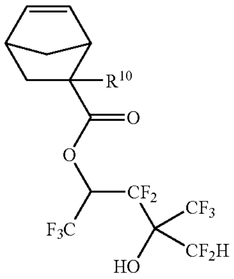
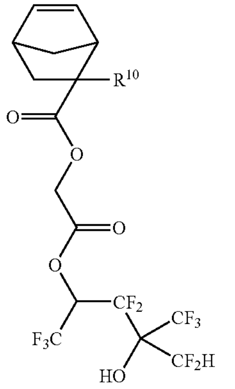
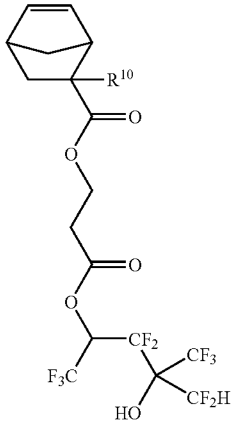
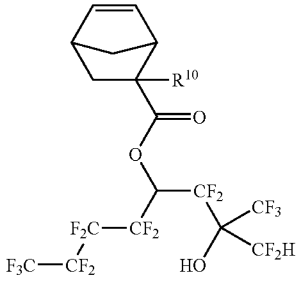
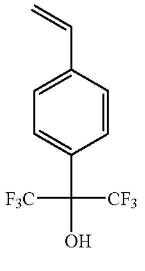
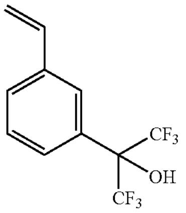
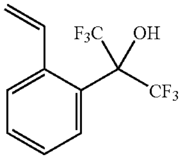
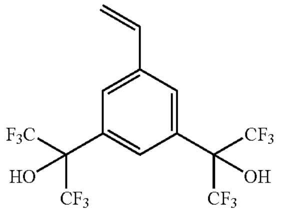

Furthermore, a repeating unit having a sulfonium salt represented by the following general formula (3) may be copolymerized with the polymer according to the present invention.

(3)

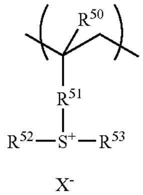

In the formula, $R^{50}$ represents a hydrogen atom or a methyl group;

$R^{51}$ represents a phenylene group, $—O—R^{54}—$, or $—C(=O)—Y—R^{54}—$;

Y represents an oxygen atom or NH;

$R^{54}$ represents a linear, branched or cyclic alkylene group having 1-6 carbon atoms, a phenylene group, or an alkenylene group and these groups may include a carbonyl group, an ester group, an ether group, or a hydroxy group;

$R^{52}$ and $R^{53}$ may be the same or different and represent a linear, branched or cyclic alkyl group having 1-12 carbon atoms that may include a carbonyl group, an ester group, or an ether group; or an aryl group having 6-12 carbon atoms; an aralkyl group having 7-20 carbon atoms; or a thiophenyl group; and $X^-$ represents a non-nucleophilic counter ion.

In order to synthesize the polymer according to the present invention, as an example, the following method may be used: placing a monomer represented by the following formula (1a) and a monomer or monomers for copolymerization when necessary in an organic solvent, adding a radical polymerization initiator to the solvent, and conducting thermal polymerization to obtain the polymer as a copolymer.

(1a)

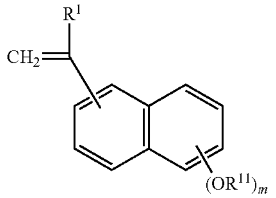

(In the formula, $R^1$ and m represent the same as above. $R^{11}$ represents a hydrogen atom, an acid labile group or hydrolytic groups such as an acetyl group.)

Examples of the organic solvent used at the time of polymerization may include: toluene, benzene, tetrahydrofuran, diethyl ether, dioxane, and the like. Examples of the polymerization initiator may include: 2,2'-azobisisobutyronitrile (AIBN), 2,2'-azobis (2,4-dimethyl valeronitrile), dimethyl-2, 2-azobis (2-methyl propionate), benzoyl peroxide, lauroyl peroxide, and the like. Polymerization is preferably conducted by heating to 50° C. to 80° C. The reaction time may be 2 to 100 hours, preferably 5 to 20 hours.

Alternatively, there is also a method of using acetoxy vinylnaphthalene instead of hydroxy vinylnaphthalene, deprotecting an acetoxy group by base hydrolysis after polymerization to alter the polymer into hydroxy polyvinylnaphthalene.

Examples of a base used for the base hydrolysis may include aqueous ammonia, triethylamine, or the like. The reaction temperature of the base hydrolysis is preferably −20 to 100° C., more preferably 0 to 60° C. The reaction time of the base hydrolysis is preferably 0.2 to 100 hours, more preferably 0.5 to 20 hours.

Furthermore, for the purpose of adjusting an alkali dissolution rate of the polymerized polymer (hydroxy polyvinylnaphthalene or hydroxy vinylnaphthalene copolymer), the hydrogen atom of the hydroxy group of the hydroxy vinylnaphthalene may be substituted with an acetyl group, an alkyl group or the like. A preferred substitution ratio is more than 1% and equal to or less than 40% of the hydroxy group. A method of substitution is to react acetyl chloride or alkyl halides with the polymer in the presence of a base to obtain a polymer in which hydrogen atoms of hydroxy groups (phenolic hydroxy groups) of hydroxy vinylnaphthalene are partially protected by an acetyl group or an alkyl group.

The polymer according to the present invention preferably has a weight average molecular weight of 1,000 to 500,000, more preferably 2,000 to 30,000. When the weight average molecular weight is 1,000 or more, the resist composition has sufficient thermal resistance. When the weight average molecular weight is 500,000 or less, the resist composition has sufficient alkali solubility and thus there is less possibility that an undercut phenomenon is caused after a pattern is formed.

In addition, the polymer according to the present invention preferably has a narrow molecular weight distribution of 1.0 to 2.0, in particular, 1.0 to 1.5. When the polymer has such a molecular weight distribution, there is less possibility that foreign matters are observed on a pattern or pattern profiles deteriorate after exposure due to low molecular weight polymers or high molecular weight polymers. As the pattern rule becomes finer, the influences of such a molecular weight and a molecular weight distribution tend to become larger. Therefore, in order to obtain a resist composition to be suitably used for fine pattern dimensions, the polymer preferably has a molecular weight distribution in the range.

Furthermore, it is also possible to blend two or more polymers which have different composition ratios, molecular weight distributions, or molecular weights.

The polymer according to the present invention is used as a base resin of a negative resist composition. Such a polymer is used as a base resin and the base resin is properly combined and mixed with an organic solvent, an acid generator, a crosslinker, a dissolution inhibitor, a basic compound, a surfactant, or the like depending on a purpose to provide a negative resist composition. Thus, a catalytic reaction decreases a dissolution rate of the polymer in a developer in an exposed area.

Therefore, such a negative resist composition exhibits extremely high sensitivity. The negative resist composition exhibits a high dissolution contrast of a resist film; exhibits high resolution; has exposure margin; has excellent process applicability; provides excellent pattern profiles after being exposed, exhibits more excellent etching resistance; and in particular, provides small critical dimension bias between dense patterns and isolated patterns because of being capable of controlling acid diffusion. Therefore, the negative resist composition is highly practical, and very useful as a resist composition for VLSIs.

In particular, when an acid generator is added to the negative resist composition to provide a chemically amplified negative resist composition which uses an acid catalytic reaction, the resist composition has higher sensitivity and more excellent properties and such a resist composition is extremely useful.

As mentioned above, a dissolution inhibitor may be added to the negative resist composition according to the present invention. Addition of a dissolution inhibitor increases the difference of dissolution rates in an exposed area and a non-exposed area, thereby further enhancing resolution.

Examples of such a dissolution inhibitor may include a compound having a carboxyl group and a phenolic hydroxy group. For example, one or more kinds of compounds selected from the following group I and group II may be used.

[Group I]

Compounds wherein hydrogen atoms of phenolic hydroxyl groups of compounds represented by the following general formulae (A1) to (A10) are substituted in part or in entirety with —$R^{401}$—COOH ($R^{401}$ represents a linear or branched alkylene group having 1-10 carbon atoms), and a mole ratio of the phenolic hydroxyl group (C) and the group (D) represented by ≡C—COOH in a molecule satisfy C/(C+D)=0.1 to 1.0.

(A1)

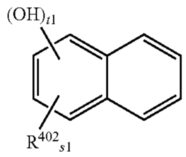

(A2)

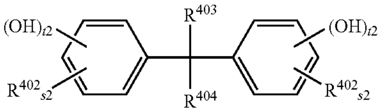

(A3)

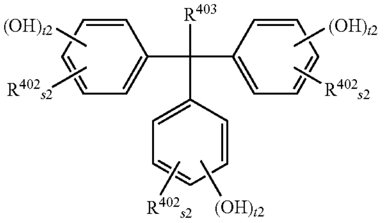

(A4)

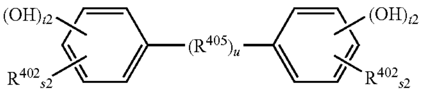

(A5)

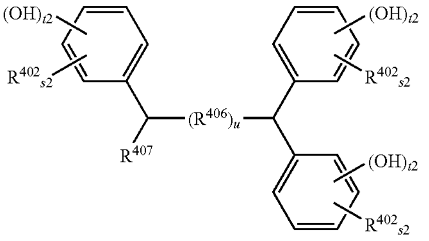

(A6)

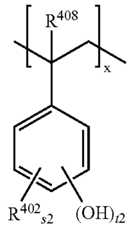

-continued (A7)

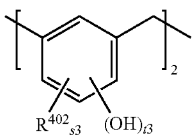

(A8)

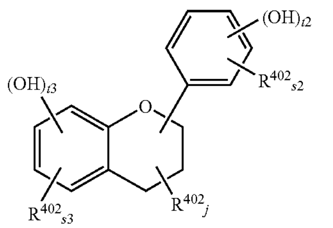

(A9)

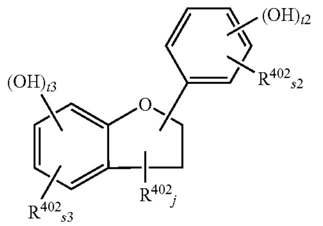

(A10)

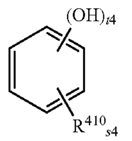

In the formulae, $R^{408}$ represents a hydrogen atom or a methyl group. $R^{402}$ and $R^{403}$ independently represent a hydrogen atom or a linear or branched alkyl group or alkenyl group having 1-8 carbon atoms. $R^{404}$ represents a hydrogen atom, a linear or branched alkyl group or alkenyl group having 1-8 carbon atoms, or $-(R^{409})_h-COOR'$ (R' represents a hydrogen atom or $-R^{409}-COOH$). $R^{405}$ represents $-(CH_2)_i-$ (i=2-10), an arylene group having 6-10 carbon atoms, a carbonyl group, a sulfonyl group, an oxygen atom, or a sulfur atom. $R^{406}$ represents an alkylene group having 1-10 carbon atoms, an arylene group having 6-10 carbon atoms, a carbonyl group, a sulfonyl group, an oxygen atom, or a sulfur atom. $R^{407}$ represents a hydrogen atom, a linear or branched alkyl group or alkenyl group having 1-8 carbon atoms, a phenyl group substituted with a hydroxyl group or a naphthyl group substituted with a hydroxyl group. $R^{409}$ represents a linear or branched alkyl group or alkenyl group having 1-10 carbon atoms, or $-R^{411}-COOH$. $R^{410}$ represents a hydrogen atom, a linear or branched alkyl group or alkenyl group having 1-8 carbon atoms, or $-R^{411}-COOH$. $R^{411}$ represents a linear or branched alkylene group having 1-10 carbon atoms. j is 0 to 3. s1 to s4 and t1 to t4 are the number that satisfy s1+t1=8, s2+t2=5, s3+t3=4, and s4+t4=6, and that make at least one hydroxyl group exist in each phenyl skeleton. κ is the number that makes the weight average molecular weight of the compound represented by the formula (A6) fall within the range of 1,000 to 5,000. λ is the number that makes the weight average molecular weight of the compound represented by the formula (A7) fall within the range of 1,000 to 10,000. u and h are 0 or 1.

[Group II]

Compounds represented by the following general formulae (A11) to (A15).

(A11)

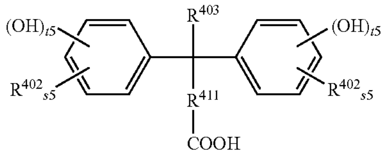

(A12)

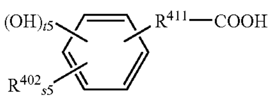

(A13)

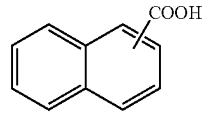

(A14)

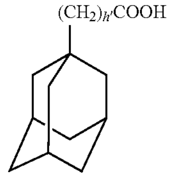

(A15)

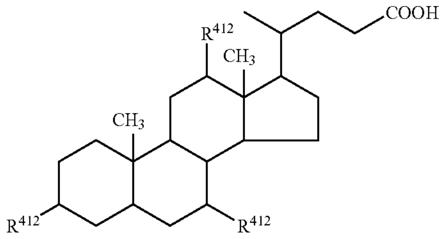

In the formulae, $R^{402}$, $R^{403}$, and $R^{411}$ represent the same as above. $R^{412}$ represents a hydrogen atom or a hydroxyl group. s5 and t5 satisfy s5≧0, t5≧0, and s5+t5=5. h' is 0 or 1.

Furthermore, examples of such a dissolution inhibitor may include calixarenes or fullerenes with a phenol group.

As mentioned above, an organic solvent may be further added to the negative resist composition according to the present invention. As the organic solvent, any organic solvent that dissolves a base resin, an acid generator and other additives may be used. Examples of such an organic solvent may include: ketones such as cyclohexanone, methyl-2-n-amyl ketone; alcohols such as 3-methoxy butanol, 3-methyl-3-methoxy butanol, 1-methoxy-2-propanol, 1-ethoxy-2-propanol; ethers such as propylene glycol monomethyl ether, ethylene glycol monomethyl ether, propylene glycol monoethyl ether, ethylene glycol monoethyl ether, propylene glycol dimethyl ether, or diethylene glycol dimethyl ether; esters such as propylene glycol monomethyl ether acetate, propylene glycol monoethyl ether acetate, ethyl lactate, ethyl pyruvate, butyl acetate, methyl 3-methoxypropionate, ethyl 3-ethoxypropionate, tert-butyl acetate, tert-butyl propionate, or propylene glycol mono tert-butyl ether acetate; lactones such as γ-butyrolactone. However, the solvents are not limited thereto.

Above solvents may be used alone or in admixture. In the present invention, among the solvents, diethylene glycol dimethyl ether, 1-ethoxy-2-propanol, propylene glycol monomethyl ether acetate, or a mixture thereof are preferably used because these solvents have very high solubility of acid generators in resist components.

The amount of the organic solvent to be used is preferably 200 to 1,000 parts (parts by mass, hereafter parts denote parts by mass), and more preferably 400 to 800 parts to 100 parts of the base resin.

As mentioned above, an acid generator may be further added to the negative resist composition according to the present invention. Examples of such an acid generator are as follows:

(i) an onium salt represented by the following general formulae (P1a-1), (P1a-2) or (P1b), (ii) a diazomethane derivative represented by the following general formula (P2), (iii) a glyoxime derivative represented by the following general formula (P3), (iv) a bis sulfone derivative represented by the following general formula (P4), (v) a sulfonate of an N-hydroxy imide compound represented by the following general formula (P5), (vi) a β-keto sulfonic-acid derivative, (vii) a disulfone derivative, (viii) a nitro benzyl sulfonate derivative, and (ix) a sulfonate derivative, and the like.

(P1a-1)

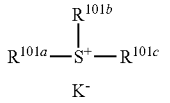

(P1a-2)

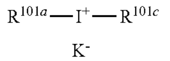

(In the formulae, $R^{101a}$, $R^{101b}$, and $R^{101c}$ independently represent a linear, branched or cyclic alkyl group, alkenyl group, oxoalkyl group or oxoalkenyl group each having 1-12 carbon atoms, an aryl group having 6-20 carbon atoms, or an aralkyl group or an aryl oxoalkyl group having 7-12 carbon atoms. Hydrogen atoms in part or in entirety of these groups may be substituted with an alkoxy group or the like. $R^{101b}$ and $R^{101c}$ may form a ring. In the case that they form a ring, $R^{101b}$ and $R^{101c}$ represent an alkylene group having 1-6 carbon atoms respectively. $K^-$ represents a non-nucleophilic counter ion.)

The $R^{101a}$, $R^{101b}$, and $R^{101c}$ may be the same or different mutually. Examples thereof as an alkyl group may include: a methyl group, an ethyl group, a propyl group, an isopropyl group, an n-butyl group, a sec-butyl group, a tert-butyl group, a pentyl group, a hexyl group, a heptyl group, an octyl group, a cyclopentyl group, a cyclohexyl group, a cycloheptyl group, a cyclopropyl methyl group, a 4-methyl cyclohexyl group, a cyclohexyl methyl group, a norbornyl group, an adamantyl group, and the like. Examples of an alkenyl group may include: a vinyl group, an allyl group, a propenyl group, a butenyl group, a hexenyl group, a cyclohexenyl group, and the like. Examples of an oxo alkyl group may include: 2-oxocyclopentyl group, 2-oxocyclohexyl group, 2-oxopropyl group, 2-cyclopentyl-2-oxoethyl group, 2-cyclohexyl-2-oxoethyl group, 2-(4-methylcyclohexyl)-2-oxoethyl group, and the like. Examples of an aryl group may include: a phenyl group, a naphthyl group, and the like; an alkoxy phenyl group such as p-methoxyphenyl group, m-methoxyphenyl group, o-methoxyphenyl group, an ethoxyphenyl group, p-tert-butoxyphenyl group or m-tert-butoxy phenyl group; an alkyl phenyl group such as 2-methylphenyl group, 3-methylphenyl group, 4-methylphenyl group, an ethylphenyl group, 4-tert-butylphenyl group, 4-butylphenyl group, or a dimethyl phenyl group; an alkyl naphthyl group such as a methylnaphthyl group or an ethyl naphthyl group; an alkoxy naphthyl group such as a methoxy naphthyl group or an ethoxy naphthyl group; a dialkyl naphthyl group such as a dimethyl naphthyl group or a diethyl naphthyl group; a dialkoxy naphthyl group such as a dimethoxy naphthyl group or a diethoxy naphthyl group. Examples of an aralkyl group may include a benzyl group, a phenylethyl group, a phenethyl group, and the like. Examples of an aryl oxoalkyl group may include: 2-aryl-2-oxoethyl group such as 2-phenyl-2-oxoethyl group, 2-(1-naphthyl)-2-oxoethyl group, 2-(2-naphthyl)-2-oxoethyl group, and the like.

Examples of a non-nucleophilic counter ion as $K^-$ may include: a halide ion such as a chloride ion or a bromide ion; a fluoro alkyl sulfonate such as triflate, 1,1,1-trifluoro ethanesulfonate, or nonafluoro butane sulfonate; an aryl sulfonate such as tosylate, benzene sulfonate, 4-fluorobenzene sulfonate, or 1,2,3,4,5-pentafluoro benzene sulfonate; and an alkyl sulfonate such as mesylate or butane sulfonate; imidic acid such as bis(trifluoromethyl sulfonyl)imide, bis(perfluoroethyl sulfonyl)imide, or bis(perfluorobutyl sulfonyl)imide; methide acid such as tris(trifluoromethyl sulfonyl)methide, or tris(perfluoroethyl sulfonyl)methide; sulfonates represented by the following general formula (K-1) which are substituted with fluorine atoms at α position; and sulfonates represented by the following general formula (K-2) which are substituted with fluorine atoms at α and β positions.

(K-1)

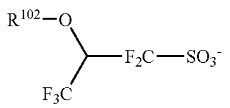

(K-2)

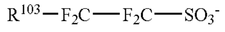

In the general formula (K-1), $R^{102}$ represents a hydrogen atom, a linear, branched or cyclic alkyl group, acyl group having 1-20 carbon atoms, an alkenyl group having 2-20 carbon atoms, an aryl group having 6-20 carbon atoms, or an aryloxy group.

In the general formula (K-2), $R^{103}$ represents a hydrogen atom, a linear, branched or cyclic alkyl group having 1-20 carbon atoms, an alkenyl group having 2-20 carbon atoms, or an aryl group having 6-20 carbon atoms.

(P1b)

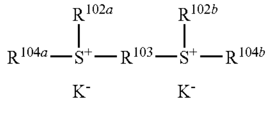

(In the formula, $R^{102a}$ and $R^{102b}$ each represents a linear, branched or cyclic alkyl group having 1-8 carbon atoms. $R^{103}$ represents a linear, branched or cyclic alkylene group having 1-10 carbon atoms. $R^{104a}$ and $R^{104b}$ each represents a 2-oxoalkyl group having 3-7 carbon atoms. $K^-$ represents a non-nucleophilic counter ion.)

Examples of the $R^{102a}$ and $R^{102b}$ may include: a methyl group, an ethyl group, a propyl group, an isopropyl group, a n-butyl group, a sec-butyl group, a tert-butyl group, a pentyl group, a hexyl group, a heptyl group, an octyl group, a cyclopentyl group, a cyclohexyl group, a cyclopropylmethyl group, 4-methylcyclohexyl group, a cyclohexyl methyl group, and the like.

Examples of the $R^{103}$ may include: a methylene group, an ethylene group, a propylene group, a butylene group, a pentylene group, a hexylene group, a heptylene group, an octylene group, a nonylene group, 1,4-cyclohexylene group, 1,2-cyclohexylene group, 1,3-cyclopentylene group, 1,4-cyclooctylene group, 1,4-cyclohexane dimethylene group, and the like.

Examples of the $R^{104a}$ and $R^{104b}$ may include: 2-oxopropyl group, 2-oxocyclopentyl group, 2-oxocyclohexyl group, 2-oxocycloheptyl group, and the like.

Examples of $K^-$ may include the same as mentioned in the formulae (P1a-1) and (P1a-2).

(P2)

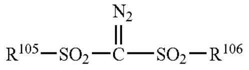

(In the formula, $R^{105}$ and $R^{106}$ independently represent a linear, branched or cyclic alkyl group or an alkyl halide group having 1-12 carbon atoms, an aryl group or an aryl halide group having 6-20 carbon atoms, or an aralkyl group having 7-12 carbon atoms.)

Examples of an alkyl group as $R^{105}$ and $R^{106}$ may include: a methyl group, an ethyl group, a propyl group, an isopropyl group, a n-butyl group, a sec-butyl group, a tert-butyl group, a pentyl group, a hexyl group, a heptyl group, an octyl group, an amyl group, a cyclopentyl group, a cyclohexyl group, a cycloheptyl group, a norbornyl group, an adamantyl group, and the like.

Examples of an alkyl halide group as $R^{105}$ and $R^{106}$ may include: trifluoromethyl group, 1,1,1-trifluoroethyl group, 1,1,1-trichloroethyl group, nonafluoro butyl group, and the like. Examples of an aryl group may include: a phenyl group, an alkoxyphenyl group such as p-methoxyphenyl group, m-methoxyphenyl group, o-methoxyphenyl group, an ethoxyphenyl group, p-tert-butoxyphenyl group, or m-tert-butoxyphenyl group; and an alkylphenyl group such as 2-methylphenyl group, 3-methylphenyl group, 4-methylphenyl group, an ethylphenyl group, 4-tert-butylphenyl group, 4-butylphenyl group, or a dimethylphenyl group.

Examples of an aryl halide group as $R^{105}$ and $R^{106}$ may include: a fluorophenyl group, a chlorophenyl group, 1,2,3,4,5-pentafluoro phenyl group, and the like.

Examples of an aralkyl group as $R^{105}$ and $R^{106}$ may include: a benzyl group, a phenethyl group, and the like.

(P3)

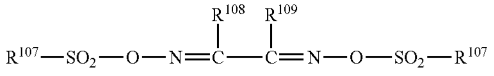

(In the formula, $R^{107}$, $R^{108}$ and $R^{109}$ independently represent a linear, branched, cyclic alkyl group or an alkyl halide group having 1-12 carbon atoms, an aryl group or an aryl halide group having 6-20 carbon atoms, or an aralkyl group having 7-12 carbon atoms. $R^{108}$ and $R^{109}$ may be bonded to each other and form a cyclic structure. When they form a cyclic structure, $R^{108}$ and $R^{109}$ each independently represents a linear or branched alkylene group having 1-6 carbon atoms.)

Examples of the alkyl group, the alkyl halide group, the aryl group, the aryl halide group, and the aralkyl group as $R^{107}$, $R^{108}$ and $R^{109}$ may be the same as those explained for $R^{105}$ and $R^{106}$. Examples of an alkylene group for $R^{108}$ and $R^{109}$ may include: a methylene group, an ethylene group, a propylene group, a butylene group, a hexylene group, and the like.

(P4)

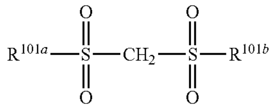

(In the formula, $R^{101a}$ and $R^{101b}$ are the same as explained above.)

(P5)

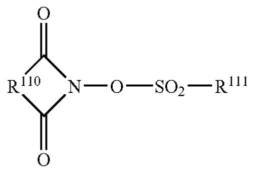

(In the formula, $R^{110}$ represents an arylene group having 6-10 carbon atoms, an alkylene group having 1-6 carbon atoms or an alkenylene group having 2-6 carbon atoms. Hydrogen atoms in part or in entirety of these groups may be further substituted with a linear or branched alkyl group or an alkoxy group having 1-4 carbon atoms, a nitro group, an acetyl group, or a phenyl group. $R^{111}$ represents a linear, branched or substituted alkyl group, alkenyl group or alkoxy alkyl group having 1-8 carbon atoms, a phenyl group or a naphthyl group. Hydrogen atoms in part or in entirety of these groups may be substituted with an alkyl group or an alkoxy group having 1-4 carbon atoms; a phenyl group which may be substituted with an alkyl group or an alkoxy group having 1-4 carbon atoms, a nitro group or an acetyl group; a hetero aromatic group having 3-5 carbon atoms; or a chlorine atom or a fluorine atom.)

Examples of the arylene group as $R^{110}$ may include: 1,2-phenylene group, 1,8-naphtylene group, and the like. Examples of the alkylene group may include: a methylene group, an ethylene group, a trimethylene group, a tetramethylene group, a phenylethylene group, a norbornane-2,3-di-yl group, and the like. Examples of the alkenylene group may include: 1,2-vinylene group, 1-phenyl-1,2-vinylene group, 5-norbornene-2,3-di-yl group, and the like.

Examples of the alkyl group as $R^{111}$ may be the same as those for $R^{101a}$-$R^{101c}$. Examples of the alkenyl group as $R^{111}$ may include: a vinyl group, a 1-propenyl group, an allyl group, a 1-butenyl group, a 3-butenyl group, an isoprenyl group, a 1-pentenyl group, a 3-pentenyl group, a 4-pentenyl group, a dimethyl allyl group, a 1-hexenyl group, a 3-hexenyl group, a 5-hexenyl group, a 1-heptenyl group, a 3-heptenyl group, a 6-heptenyl group, a 7-octenyl group, and the like. Examples of the alkoxy alkyl group may include: a methoxy methyl group, an ethoxy methyl group, a propoxy methyl group, a butoxy methyl group, a pentyloxy methyl group, a hexyloxy methyl group, a heptyloxy methyl group, a methoxy ethyl group, an ethoxy ethyl group, a propoxy ethyl group, a butoxy ethyl group, a pentyloxy ethyl group, a hexyloxy ethyl group, a methoxy propyl group, an ethoxy propyl group, a propoxy propyl group, a butoxy propyl group, a methoxy butyl group, an ethoxy butyl group, a propoxy butyl group, a methoxy pentyl group, an ethoxy pentyl group, a methoxy hexyl group, a methoxy heptyl group, and the like.

Examples of the alkyl group having 1-4 carbon atoms which may be further substituted may include: a methyl group, an ethyl group, a propyl group, an isopropyl group, a n-butyl group, an isobutyl group, a tert-butyl group, and the like. Examples of the alkoxy group having 1-4 carbon atoms may include: a methoxy group, an ethoxy group, a propoxy group, an isopropoxy group, a n-butoxy group, an isobutoxy group, a tert-butoxy group, and the like.

Examples of the phenyl group which may be substituted with an alkyl group, an alkoxy group having 1-4 carbon atoms, a nitro group or an acetyl group may include: a phenyl group, a tolyl group, a p-tert-butoxy phenyl group, a p-acetyl phenyl group, a p-nitrophenyl group, and the like. Examples of a hetero aromatic group having 3-5 carbon atoms may include: a pyridyl group, a furyl group, and the like.

Examples of the onium salt may include: diphenyl iodinium trifluoromethane sulfonate, (p-tert-butoxy phenyl) phenyl iodinium trifluoromethane sulfonate, diphenyl iodinium p-toluene sulfonate, (p-tert-butoxy phenyl)phenyl iodinium p-toluene sulfonate, triphenyl sulfonium trifluoromethane sulfonate, (p-tert-butoxy phenyl)diphenyl sulfonium trifluoromethane sulfonate, bis(p-tert-butoxy phenyl) phenyl sulfonium trifluoromethane sulfonate, tris (p-tert-butoxy phenyl)sulfonium trifluoromethane sulfonate, triphenyl sulfonium p-toluene sulfonate, (p-tert-butoxy phenyl)diphenyl sulfonium p-toluene sulfonate, bis(p-tert-butoxy phenyl)phenyl sulfonium p-toluene sulfonate, tris (p-tert-butoxy phenyl)sulfonium p-toluene sulfonate, triphenyl sulfonium nonafluoro butane sulfonate, triphenyl sulfonium butane sulfonate, trimethyl sulfonium trifluoromethane sulfonate, trimethyl sulfonium p-toluene sulfonate, cyclohexyl methyl (2-oxocyclohexyl)sulfonium trifluoromethane sulfonate, cyclohexyl methyl(2-oxo cyclohexyl)sulfonium p-toluene sulfonate, dimethyl phenyl sulfonium trifluoromethane sulfonate, dimethyl phenyl sulfonium p-toluene sulfonate, dicyclohexyl phenyl sulfonium trifluoromethane sulfonate, dicyclohexyl phenyl sulfonium p-toluene sulfonate, trinaphthylsulfonium trifluoromethane sulfonate, (2-norbonyl)methyl (2-oxocyclohexyl)sulfonium trifluoromethane sulfonate, ethylene bis[methyl (2-oxocyclopentyl)sulfonium trifluoromethane sulfonate], 1,2'-naphthyl carbonyl methyl-tetrahydro thiophenium triflate, and so on.

Examples of a diazomethane derivative may include: bis (benzene sulfonyl)diazomethane, bis(p-toluene sulfonyl)diazomethane, bis(xylene sulfonyl)diazomethane, bis(cyclohexyl sulfonyl)diazomethane, bis(cyclopentyl sulfonyl) diazomethane, bis(n-butylsulfonyl)diazomethane, bis (isobutyl sulfonyl)diazomethane, bis(sec-butylsulfonyl) diazomethane, bis(n-propylsulfonyl)diazomethane, bis (isopropyl sulfonyl)diazomethane, bis(tert-butyl-sulfonyl) diazomethane, bis(n-amylsulfonyl)diazomethane, bis (isoamylsulfonyl)diazomethane, bis(sec-amylsulfonyl) diazomethane, bis(tert-amylsulfonyl)diazomethane, 1-cyclohexylsulfonyl-1-(tert-butyl-sulfonyl)diazomethane, 1-cyclohexyl sulfonyl-1-(tert-amyl sulfonyl)diazomethane, 1-tert-amyl sulfonyl-1-(tert-butyl-sulfonyl)diazomethane, and the like.

Examples of a glyoxime derivative may include: bis-O-(p-toluene sulfonyl)-α-dimethylglyoxime, bis-O-(p-toluene sulfonyl)-α-diphenyl glyoxime, bis-O-(p-toluene sulfonyl)-α-dicyclohexyl glyoxime, bis-O-(p-toluene sulfonyl)-2,3-pentanedione glyoxime, bis-O-(p-toluene sulfonyl)-2-methyl-3,4-pentanedione glyoxime, bis-O-(n-butane sulfonyl)-α-dimethylglyoxime, bis-O-(n-butane sulfonyl)-α-diphenyl glyoxime, bis-O-(n-butane sulfonyl)-α-dicyclohexyl glyoxime, bis-O-(n-butane sulfonyl)-2,3-pentanedione glyoxime, bis-O-(n-butane sulfonyl)-2-methyl-3,4-pentanedione glyoxime, bis-O-(methane sulfonyl)-α-dimethylglyoxime, bis-O-(trifluoromethane sulfonyl)-α-dimethylglyoxime, bis-O-(1,1,1-trifluoro ethane sulfonyl)-α-dimethylglyoxime, bis-O-(tert-butane sulfonyl)-α-dimethylglyoxime, bis-O-(perfluoro octane sulfonyl)-α-dimethylglyoxime, bis-O-(cyclohexane sulfonyl)-α-dimethylglyoxime, bis-O-(benzene sulfonyl)-α-dimethylglyoxime, bis-O-(p-fluorobenzene sulfonyl)-α-dimethylglyoxime, bis-O-(p-tert-butylbenzene sulfonyl)-α-dimethylglyoxime, bis-O-(xylene sulfonyl)-α-dimethylglyoxime, bis-O-(camphor sulfonyl)-α-dimethylglyoxime, and the like.

Examples of a bissulfone derivative may include: bis naphthyl sulfonyl methane, bis-trifluoro methyl sulfonyl methane, bis methyl sulfonyl methane, bis ethyl sulfonyl methane, bis propyl sulfonyl methane, bis isopropyl sulfonyl methane, bis-p-toluene sulfonyl methane, bis benzene sulfonyl methane, and the like.

Examples of the β-ketosulfone derivative may include: 2-cyclohexyl carbonyl-2-(p-toluene sulfonyl)propane, 2-isopropyl carbonyl-2-(p-toluene sulfonyl)propane, and the like.

Examples of the disulfone derivative may include: a diphenyl disulfone derivative, a diyclohexyl disulfone derivative, and the like.

Examples of the nitro benzyl sulfonate derivative may include: 2,6-dinitro benzyl p-toluenesulfonate, 2,4-dinitro benzyl p-toluenesulfonate, and the like.

Examples of the sulfonate derivative may include: 1,2,3-tris(methane sulfonyloxy)benzene, 1,2,3-tris(trifluoromethane sulfonyloxy)benzene, 1,2,3-tris(p-toluene sulfonyloxy)benzene, and the like.

Examples of the sulfonate derivative of N-hydroxy imide compound may include: N-hydroxy succinimide methane sulfonate, N-hydroxy succinimide trifluoromethane sulfonate, N-hydroxy succinimide ethane sulfonate, N-hydroxy succinimide 1-propane sulfonate, N-hydroxy succinimide 2-propane sulfonate, N-hydroxy succinimide 1-pentane sulfonate, N-hydroxy succinimide 1-octane sulfonate, N-hydroxy succinimide p-toluenesulfonate, N-hydroxy succinimide p-methoxybenzene sulfonate, N-hydroxy succinimide 2-chloroethane sulfonate, N-hydroxy succinimide benzenesulfonate, N-hydroxy succinimide-2,4,6-trimethyl benzene sulfonate, N-hydroxy succinimide 1-naphthalene sulfonate, N-hydroxy succinimide 2-naphthalene sulfonate, N-hydroxy-2-phenyl succinimide methane sulfonate, N-hydroxy maleimide methane sulfonate, N-hydroxy maleimide ethane sulfonate, N-hydroxy-2-phenyl maleimide methane sulfonate, N-hydroxy glutarimide methane sulfonate, N-hydroxy glutarimide benzenesulfonate, N-hydroxy phthalimide methane sulfonate, N-hydroxy phthalimide benzenesulfonate, N-hydroxy phthalimide trifluoromethane sulfonate, N-hydroxy phthalimide p-toluenesulfonate, N-hydroxy naphthalimide methane sulfonate, N-hydroxy naphthalimide benzenesulfonate, N-hydroxy-5-norbornene-2,3-dicarboxylmide methane sulfonate, N-hydroxy-5-norbornene-2,3-dicarboxylmide trifluoromethane sulfonate, N-hydroxy-5-norbornene-2,3-dicarboxylmide p-toluenesulfonate, and the like.

In particular, preferred examples of acid generators may include: an onium salt such as triphenyl sulfonium trifluoromethane sulfonate, (p-tert-butoxy phenyl)diphenyl sulfonium trifluoromethane sulfonate, tris (p-tert-butoxy phenyl) sulfonium trifluoromethane sulfonate, triphenyl sulfonium p-toluene sulfonate, (p-tert-butoxy phenyl)diphenyl sulfonium p-toluene sulfonate, tris (p-tert-butoxy phenyl)sulfonium p-toluene sulfonate, trinaphthylsulfonium trifluoromethane sulfonate, cyclohexyl methyl (2-oxocyclohexyl) sulfonium trifluoromethane sulfonate, (2-norbonyl)methyl (2-oxocyclohexyl)sulfonium trifluoromethane sulfonate, 1,2'-naphthyl carbonylmethyl tetrahydrothiophenium triflate, and the like;

a diazomethane derivative such as bis(benzene sulfonyl) diazomethane, bis(p-toluene sulfonyl)diazomethane, bis(cyclohexyl sulfonyl)diazomethane, bis(n-butylsulfonyl)diazomethane, bis(isobutyl sulfonyl)diazomethane, bis(sec-butylsulfonyl)diazomethane, bis(n-propyl sulfonyl) diazomethane, bis(isopropyl sulfonyl)diazomethane, bis (tert-butylsulfonyl)diazomethane, and the like;

a glyoxime derivative, such as bis-O-(p-toluene sulfonyl)-$\alpha$-dimethylglyoxime, bis-O-(n-butane sulfonyl)-$\alpha$-dimethylglyoxime, and the like;

a bissulfone derivative, such as bisnaphthyl sulfonyl methane;

a sulfonate derivative of N-hydroxyimide compounds, such as N-hydroxy succinimide methane sulfonate, N-hydroxy succinimide trifluoromethane sulfonate, N-hydroxy succinimide 1-propane sulfonate, N-hydroxy succinimide 2-propane sulfonate, N-hydroxy succinimide 1-pentane sulfonate, N-hydroxy succinimide p-toluene sulfonate, N-hydroxy naphthalimide methane sulfonate, N-hydroxy naphthalimide benzenesulfonate, and the like.

Furthermore, an oxime type acid generator disclosed in WO 2004/074242 A2 may be added.

It should be noted that the acid generators mentioned above may be used alone or in admixture. Onium salts have excellent effects of enhancing rectangularity, and diazomethane derivatives and glyoxime derivatives have excellent effects of reducing standing waves. Therefore, combining an onium salt and a diazomethane derivative or a glyoxime derivative makes it possible to make fine adjustments of profiles.

The amount of the acid generator to be added is preferably 0.1 to 50 parts, more preferably 0.5 to 40 parts to 100 parts of the base resin. When the amount is 0.1 parts or more, a sufficient amount of an acid is generated on exposure, and thus there is less possibility that sensitivity and resolution are deteriorated. When the amount is 50 parts or less, there is less possibility that transmittance of a resist decreases and resolution is deteriorated.

As mentioned above, a crosslinker may be further added to the negative resist composition according to the present invention. Examples of the crosslinker which can be used in the present invention may include: a melamine compound, a guanamine compound, a glycol uryl compound or an urea compound substituted with at least one group selected from a methylol group, an alkoxy methyl group and an acyloxy methyl group; an epoxy compound, an isocyanate compound, an azide compound, a compound including a double bond such as an alkenyl ether group, and the like. Although they may be used as an additive, they also may be introduced into a polymer side chain as a pendant group. Moreover, a compound containing a hydroxy group may also be used as a crosslinker.

Examples of the epoxy compound among the above-mentioned specific examples of the crosslinker may include: tris (2,3-epoxypropyl)isocyanurate, trimethylol methanetriglycidyl ether, trimethylol propane triglycidyl ether, triethylol ethanetriglycidyl ether, and the like. Examples of the melamine compound may include: hexamethylol melamine, hexamethoxy methyl melamine, a compound in which 1-6 methylol groups of hexamethylol melamine are methoxy methylated or a mixture thereof, hexamethoxy ethyl melamine, hexaacyloxy methyl melamine, a compound in which 1-6 methylol groups of hexamethylol melamine are acyloxy methylated or a mixture thereof, and the like. Examples of a guanamine compound may include: tetramethylol guanamine, tetra methoxy methyl guanamine, a compound in which 1-4 methylol groups of tetramethylol guanamine are methoxy-methylated and a mixture thereof, tetramethoxy ethyl guanamine, tetraacyloxy guanamine, a compound in which 1-4 methylol groups of tetramethylol guanamine are acyloxy-methylated and a mixture thereof, and the like. Examples of a glycol uryl compound may include: tetramethylol glycol uryl, tetramethoxy glycol uryl, tetramethoxy methyl-glycol uryl, a compound in which 1-4 methylol groups of tetramethylol glycol uryl are methoxy methylated or a mixture thereof, and a compound in which 1-4 methylol group of tetramethylol glycol uryl are acyloxy methylated or a mixture thereof, and the like. Examples of a urea compound may include: tetra methylol urea, tetra methoxy methyl urea, a compound in which 1-4 methylol groups of tetra methylol urea are methoxy-methylated or a mixture thereof, and tetra methoxy ethyl urea, and the like.

Examples of the isocyanate compound may include: tolylene diisocyanate, diphenyl methane diisocyanate, hexamethylene diisocyanate, cyclohexane diisocyanate, and the like. Examples of the azide compound may include: 1,1'-biphenyl-4,4'-bisazide, 4,4'-methylidene bisazide, and 4,4'-oxy-bisazide, and the like.

Examples of the compound containing an alkenyl ether group may include: ethylene glycol divinyl ether, triethyleneglycol divinyl ether, 1,2-propanediol divinyl ether, 1,4-butanediol divinyl ether, tetramethylene-glycol divinyl ether, neo pentyl glycol divinyl ether, trimethylol-propane trivinyl ether, hexane diol divinyl ether, 1,4-cyclohexane diol divinyl ether, pentaerythritol trivinyl ether, pentaerythritol tetra vinyl ether, sorbitol tetra vinyl ether, sorbitol penta vinyl ether, and trimethylol-propane trivinyl ether, and the like.

The amount of the crosslinker to be blended is preferably 0 to 50 parts, more preferably 5 to 50 parts, and still more preferably 10 to 30 parts per 100 parts of the base resin. The crosslinker may be used alone or in admixture. When the amount is 5 parts or more, resolution is sufficiently enhanced. When the amount is 50 parts or less, there is less possibility of pattern collapse or deterioration of resolution.

As mentioned above, a basic compound may be further added to the negative resist composition according to the present invention.

As the basic compound, suitable compounds are capable of suppressing an acid diffusion rate when an acid generated from an acid generator diffuses in a resist film. Addition of such a basic compound suppresses a diffusion rate of an acid in a resist film, thereby enhancing resolution, suppressing change of sensitivity after exposure, reducing substrate dependency and environmental dependency, and improving exposure margin, pattern profiles and the like.

Examples of such a basic compound may include: primary, secondary and tertiary aliphatic amines, mixed amines, aromatic amines, heterocyclic amines, nitrogen-containing compounds having a carboxy group, nitrogen-containing compounds having a sulfonyl group, nitrogen-containing compounds having a hydroxyl group, nitrogen-containing compounds having a hydroxy phenyl group, nitrogen-containing alcohol compounds, amide derivatives, imide derivatives and the like.

Examples of the primary aliphatic amines may include: ammonia, methylamine, ethylamine, n-propylamine, isopropylamine, n-butylamine, isobutyl amine, sec-butyl-amine, tert-butylamine, pentylamine, tert-amylamine, cyclopentyl amine, hexylamine, cyclohexyl amine, heptylamine, octylamine, nonylamine, decyl amine, dodecylamine, cetylamine, methylene diamine, ethylenediamine, tetraethylene pentamine and the like. Examples of the secondary aliphatic amines may include: dimethylamine, diethylamine, di-n-propylamine, diisopropyl amine, di-n-butylamine, diisobutyl amine, di-sec-butylamine, dipentylamine, dicyclopentyl amine, dihexyl amine, dicyclohexyl amine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylene pentamine and the like. Examples of the tertiary aliphatic amines may include: trimethylamine, triethylamine, tri-n-propylamine, triisopropyl amine, tri-n-butyl amine, triisobutyl amine, tri-sec-butyl amine, tripentyl amine, tricyclopentyl amine, trihexyl amine, tricyclohexyl amine, triheptyl amine, trioctyl amine, trinonyl amine, tridecyl amine, tridodecyl amine, tricetyl amine, N,N,N',N'-tetra methyl methylene diamine, N,N,N',N'-tetramethyl ethylenediamine, N,N,N',N'-tetramethyl tetraethylene pentamine and the like.

Moreover, examples of the mixed amines may include: a dimethyl ethylamine, methyl ethyl propyl amine, benzylamine, phenethyl amine, benzyl dimethylamine, and the like.

Examples of the aromatic amines and the heterocyclic amines may include: an aniline derivative (for example, aniline, N-methyl aniline, N-ethyl aniline, N-propyl aniline, N,N-dimethylaniline, 2-methyl aniline, 3-methyl aniline, 4-methyl aniline, ethyl aniline, propyl aniline, trimethyl aniline, 2-nitroaniline, 3-nitroaniline, 4-nitroaniline, 2,4-dinitro aniline, 2,6-dinitro aniline, 3,5-dinitro aniline, N,N-dimethyl toluidine and the like), diphenyl(p-tolyl)amine, methyl diphenylamine, triphenylamine, phenylenediamine, naphthylamine, diamino naphthalene, a pyrrole derivative (for example, pyrrole, 2H-pyrrole, 1-methylpyrrole, 2,4-dimethylpyrrole, 2,5-dimethylpyrrole, N-methylpyrrole, and the like), oxazole derivative (for example, oxazole, isoxazole and the like), a thiazole derivative (for example, thiazole, isothiazole, and the like), an imidazole derivative (for example, imidazole, 4-methyl imidazole, 4-methyl-2-phenyl imidazole and the like), a pyrazole derivative, a furazan derivative, a pyrroline derivative (for example, pyrroline, 2-methyl-1-pyrroline and the like), a pyrrolidine derivative (for example, pyrrolidine, N-methylpyrrolidine, pyrrolidinone, N-methylpyrolidone and the like), an imidazoline derivative, an imidazolidine derivative, a pyridine derivative (for example, pyridine, methylpyridine, ethyl pyridine, propyl pyridine, butyl pyridine, 4-(1-butyl pentyl)pyridine, dimethylpyridine, trimethylpyridine, triethyl pyridine, phenyl pyridine, 3-methyl-2-phenyl pyridine, 4-tert-butyl pyridine, diphenyl pyridine, benzyl pyridine, methoxy pyridine, butoxy pyridine, dimethoxy pyridine, 1-methyl-2-pyridine, 4-pyrrolidino pyridine, 1-methyl-4-phenylpyridine, 2-(1-ethylpropyl)pyridine, amino pyridine, dimethyl amino pyridine and the like), a pyridazine derivative, a pyrimidine derivative, a pyrazine derivative, a pyrazoline derivative, a pyrazolidine derivative, a piperidine derivative, a piperazine derivative, a morpholine derivative, an indole derivative, an isoindole derivative, a 1H-indazole derivative, an indoline derivative, a quinoline derivative (for example, quinoline, 3-quinoline carbonitrile, and the like), an isoquinoline derivative, a cinnoline derivative, a quinazoline derivative, a quinoxaline derivative, a phthalazine derivative, a purine derivative, a pteridine derivative, a carbazole derivative, a phenanthridine derivative, an acridine derivative, a phenazine derivative, 1,10-phenanthroline derivative, an adenine derivative, an adenosine derivative, a guanine derivative, a guanosine derivative, an uracil derivative, an uridine derivative and the like.

Furthermore, examples of the nitrogen-containing compounds having a carboxy group may include: aminobenzoic acid, indole carboxylic acid, and an amino acid derivative (for example, nicotinic acid, alanine, arginine, aspartic acid, glutamic acid, glycine, histidine, isoleucine, glycyl leucine, leucine, methionine, phenylalanine, threonine, lysine, 3-aminopyrazine-2-carboxylic acid, or methoxy alanine) and the like. Examples of the nitrogen-containing compounds having a sulfonyl group may include: 3-pyridine sulfonic acid, pyridinium p-toluene sulfonate and the like. Examples of the nitrogen-containing compounds having a hydroxyl group, the nitrogen-containing compounds having a hydroxy phenyl group, and the nitrogen-containing alcohol compounds may include: 2-hydroxy pyridine, amino cresol, 2,4-quinoline diol, 3-indole methanol hydrate, monoethanolamine, diethanolamine, triethanolamine, N-ethyl diethanolamine, N,N-diethyl ethanolamine, triisopropanol amine, 2,2'-iminodiethanol, 2-amino ethanol, 3-amino-1-propanol, 4-amino-1-butanol, 4-(2-hydroxyethyl)morpholine, 2-(2-hydroxyethyl) pyridine, 1-(2-hydroxyethyl)piperazine, 1-[2-(2-hydroxyethoxy)ethyl]piperazine, piperidine ethanol, 1-(2-hydroxy ethyl)pyrrolidine, 1-(2-hydroxyethyl)-2-pyrrolidinone, 3-piperidino-1,2-propanediol, 3-pyrrolidino-1,2-propanediol, 8-hydroxy julolidine, 3-quinuclidinol, 3-tropanol, 1-methyl-2-pyrrolidine ethanol, 1-aziridine ethanol, N-(2-hydroxyethyl)phthalimide, N-(2-hydroxyethyl) isonicotinamide, and the like.

Examples of the amide derivatives may include: formamide, N-methyl formamide, N,N-dimethylformamide, acetamide, N-methyl acetamide, N,N-dimethylacetamide, propione amide, benzamide, and the like.

Examples of the imide derivatives may include: phthalimide, succinimide, maleimide, and the like.

Furthermore, one, two or more selected from basic compound represented by the following general formula (B)-1 may be added.

$$N(X)_n(Y)_{3-n} \quad (B)\text{-}1$$

(In the formula, n is 1, 2, or 3. The side chain X may be the same or different, and represents the following general formulae (X)-1 to (X)-3. The side chain Y may be the same or different, and represents a hydrogen atom or a linear, branched or cyclic alkyl group having 1-20 carbon atoms which may contain an ether group or a hydroxyl group. Moreover, X may bond to each other and form a ring.)

(X)-1

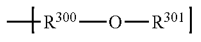

(X)-2

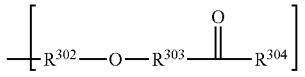

(X)-3

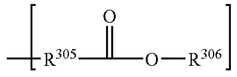

In the formulae, $R^{300}$, $R^{302}$, and $R^{305}$ represent a linear or branched alkylene group having 1-4 carbon atoms, and $R^{301}$ and $R^{304}$ represent a hydrogen atom or a linear, branched or cyclic alkyl group having 1-20 carbon atoms, which may contain one or more of a hydroxy group, an ether group, an ester group, and a lactone ring.

$R^{303}$ represents a single bond, or a linear or branched alkylene group having 1-4 carbon atoms.

$R^{306}$ represents a linear, branched or cyclic alkyl group having 1-20 carbon atoms, which may contain one or more of a hydroxy group, an ether group, an ester group, and a lactone ring.

Examples of the compound represented by the general formula (B)-1 may include, but are not limited to, tris (2-methoxy methoxy ethyl)amine, tris{2-(2-methoxyethoxy) ethyl}amine, tris{2-(2-methoxy ethoxy methoxy) ethyl}amine, tris{2-(1-methoxy ethoxy)ethyl}amine, tris {2-(1-ethoxy ethoxy)ethyl}amine, tris {2-(1-ethoxy propoxy) ethyl}amine, tris[2-{2-(2-hydroxy ethoxy)ethoxy}ethyl] amine, 4,7,13,16,21,24-hexaoxa-1,10-diazabicyclo[8.8.8] hexacosane, 4,7,13,18-tetraoxa-1,10-diazabicyclo[8.5.5] eicosane, 1,4,10,13-tetraoxa-7,16-diazabicyclo octadecane, 1-aza-12-crown-4,1-aza-15-crown-5,1-aza-18-crown-6, tris (2-formyloxy-ethyl)amine, tris (2-acetoxy ethyl)amine, tris (2-propionyloxy-ethyl)amine, tris (2-butylyloxy-ethyl) amine, tris(2-isobutyryl oxy-ethyl) amine, tris (2-valeryloxy-ethyl)amine, tris (2-pivaloyloxy-ethyl)amine, N,N-bis(2-acetoxy ethyl) 2-(acetoxyacetoxy)ethylamine, tris(2-methoxycarbonyl oxy-ethyl)amine, tris (2-tert-butoxy carbonyl oxy-ethyl)amine, tris[2-(2-oxo propoxy)ethyl] amine, tris[2-(methoxycarbonyl methyl)oxy-ethyl]amine, tris[2-(tert-butoxycarbonylmethyloxy)ethyl]amine, tris[2-(cyclohexyloxy carbonylmethyloxy)ethyl]amine, tris(2-methoxycarbonyl ethyl)amine, tris (2-ethoxy carbonyl ethyl) amine, N,N-bis(2-hydroxy ethyl) 2-(methoxycarbonyl) ethylamine, N,N-bis(2-acetoxy ethyl) 2-(methoxycarbonyl) ethylamine, N,N-bis(2-hydroxy ethyl) 2-(ethoxy carbonyl) ethylamine, N,N-bis(2-acetoxy ethyl) 2-(ethoxy carbonyl) ethylamine, N,N-bis(2-hydroxy ethyl) 2-(2-methoxy ethoxy carbonyl)ethylamine, N,N-bis(2-acetoxy ethyl) 2-(2-methoxy ethoxy carbonyl)ethylamine, N,N-bis (2-hydroxy ethyl) 2-(2-hydroxy ethoxy carbonyl)ethylamine, N,N-bis(2-acetoxy ethyl) 2-(2-acetoxy ethoxy carbonyl)ethylamine, N,N-bis(2-hydroxy ethyl) 2-[(methoxycarbonyl)methoxycarbonyl]ethylamine, N,N-bis(2-acetoxy ethyl) 2-[(methoxycarbonyl)methoxycarbonyl]ethylamine, N,N-bis(2-hydroxy ethyl) 2-(2-oxo propoxy carbonyl)ethylamine, N,N-bis(2-acetoxy ethyl) 2-(2-oxo propoxy carbonyl)ethylamine, N,N-bis(2-hydroxy ethyl) 2-(tetrahydro furfuryl oxycarbonyl)ethylamine, N,N-bis(2-acetoxy ethyl) 2-(tetrahydro furfuryl oxy-carbonyl)ethylamine, N,N-bis(2-hydroxy ethyl) 2-[(2-oxo tetrahydrofuran-3-yl)oxy-carbonyl]ethylamine, N,N-bis(2-acetoxy ethyl) 2-[(2-oxo-tetrahydrofuran-3-yl)oxy-carbonyl]ethylamine, N,N-bis(2-hydroxy ethyl) 2-(4-hydroxy butoxy carbonyl)ethylamine, N,N-bis(2-formyl oxy-ethyl) 2-(4-formyloxybutoxy carbonyl)ethylamine, N,N-bis(2-formyl oxy-ethyl) 2-(2-formyloxy ethoxy carbonyl)ethylamine, N,N-bis(2-methoxy ethyl) 2-(methoxycarbonyl)ethylamine, N-(2-hydroxy ethyl)bis[2-(methoxycarbonyl)ethyl]amine, N-(2-acetoxy ethyl)bis[2-(methoxycarbonyl)ethyl]amine, N-(2-hydroxy ethyl)bis[2-(ethoxy carbonyl)ethyl]amine, N-(2-acetoxy ethyl)bis[2-(ethoxy carbonyl)ethyl]amine, N-(3-hydroxy-1-propyl)bis [2-(methoxycarbonyl)ethyl]amine, N-(3-acetoxy-1-propyl)bis[2-(methoxycarbonyl)ethyl]amine, N-(2-methoxy ethyl)bis[2-(methoxycarbonyl)ethyl]amine, N-butyl bis[2-(methoxycarbonyl)ethyl]amine, N-butyl bis[2-(2-methoxy ethoxy carbonyl)ethyl]amine, N-methyl bis(2-acetoxy ethyl) amine, N-ethyl bis(2-acetoxy ethyl)amine, N-methyl bis(2-pivaloyloxy-ethyl)amine, N-ethyl bis[2-(methoxy carbonyloxy)ethyl]amine, N-ethyl bis[2-(tert-butoxycarbonyloxy) ethyl]amine, tris (methoxycarbonyl methyl)amine, tris (ethoxy carbonyl methyl)amine, N-butyl bis(methoxycarbonyl methyl)amine, N-hexyl bis (methoxycarbonyl methyl) amine, and β-(diethylamino)-δ-valerolactone.

Furthermore, one, two or more of basic compounds having a cyclic structure represented by the following general formula (B)-2 may be added.

(B)-2

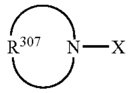

(In the formula, X represents the same as mentioned above, $R^{307}$ represents a linear or branched alkylene group having 2-20 carbon atoms, which may contain one or more of a carbonyl group, an ether group, an ester group, and a sulfide.)

Examples of (B)-2 may include: 1-[2-(methoxy methoxy) ethyl]pyrrolidine, 1-[2-(methoxy methoxy)ethyl]piperidine, 4-[2-(methoxy methoxy)ethyl]morpholine, 1-[2-[(2-methoxyethoxy)methoxy]ethyl]pyrrolidine, 1-[2-[(2-methoxyethoxy)methoxy]ethyl]piperidine, 4-[2-[(2-methoxyethoxy) methoxy]ethyl]morpholine, 2-(1-pyrrolidinyl)ethyl acetate, 2-piperidino ethyl acetate, 2-morpholino ethyl acetate, 2-(1-pyrrolidinyl)ethyl formate, 2-piperidino ethyl propionate, 2-morpholino ethyl acetoxy acetate, 2-(1-pyrrolidinyl)ethyl methoxy acetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidino propionate, methyl 3-morpholino propionate, methyl 3-(thiomorpholino) propionate, methyl 2-methyl-3-(1-pyrrolidinyl)propionate, ethyl 3-morpholino propionate, methoxycarbonyl methyl 3-piperidino propionate, 2-hydroxy ethyl 3-(1-pyrrolidinyl) propionate, 2-acetoxy ethyl 3-morpholino propionate, 2-oxo tetrahydrofuran-3-yl 3-(1-pyrrolidinyl)propionate, tetrahydrofurfuryl 3-morpholino propionate, glycidyl 3-piperidino propionate, 2-methoxy ethyl 3-morpholino propionate, 2-(2-methoxyethoxy)ethyl 3-(1-pyrrolidinyl)propionate, butyl 3-morpholino propionate, cyclohexyl 3-piperidino propionate, α-(1-pyrrolidinyl)methyl-γ-butyrolactone, β-piperidino-γ-butyrolactone, β-morpholino-δ-valerolactone, methyl 1-pyrrolidinyl acetate, methyl piperidino acetate, methyl morpholino acetate, methyl thio morpholino acetate, ethyl 1-pyrrolidinyl acetate, 2-methoxy ethyl morpholino acetate, and the like.

Furthermore, a basic compound containing a cyano group represented by the following general formulae (B)-3 to (B)-6 may be added.

(B)-3

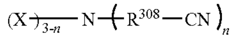

(B)-4

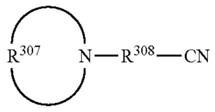

(B)-5

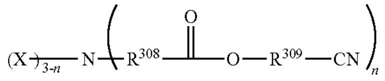

-continued (B)-6

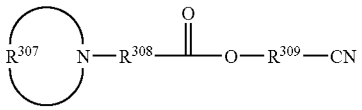

(In the formulae, X, $R^{307}$, and n are the same as above. $R^{308}$ and $R^{309}$ are the same or different, and represent a linear or branched alkylene group having 1-4 carbon atoms.)

Examples of the basic compound containing a cyano group may include: 3-(diethylamino)propiononitrile, N,N-bis(2-hydroxy ethyl)-3-amino propiononitrile, N,N-bis(2-acetoxy ethyl)-3-amino propiononitrile, N,N-bis(2-formyl oxy-ethyl)-3-amino propiononitrile, N,N-bis(2-methoxy ethyl)-3-amino propiononitrile, N,N-bis[2-(methoxy methoxy) ethyl]-3-amino propiononitrile, methyl N-(2-cyanoethyl)-N-(2-methoxy ethyl)-3-amino propionate, methyl N-(2-cyanoethyl)-N-(2-hydroxy ethyl)-3-amino propionate, methyl N-(2-acetoxy ethyl)-N-(2-cyanoethyl)-3-amino propionate, N-(2-cyanoethyl)-N-ethyl-3-amino propiononitrile, N-(2-cyanoethyl)-N-(2-hydroxy ethyl)-3-amino propiononitrile, N-(2-acetoxy ethyl)-N-(2-cyanoethyl)-3-amino propiononitrile, N-(2-cyanoethyl)-N-(2-formyl oxy-ethyl)-3-amino propiononitrile, N-(2-cyanoethyl)-N-(2-methoxy ethyl)-3-amino propiononitrile, N-(2-cyanoethyl)-N-[2-(methoxy methoxy)ethyl]-3-amino propiononitrile, N-(2-cyanoethyl)-N-(3-hydroxy-1-propyl)-3-amino propiononitrile, N-(3-acetoxy-1-propyl)-N-(2-cyanoethyl)-3-amino propiononitrile, N-(2-cyanoethyl)-N-(3-formyloxy-1-propyl)-3-amino propiononitrile, N-(2-cyanoethyl)-N-tetrahydrofurfuryl-3-amino propiononitrile, N,N-bis(2-cyanoethyl)-3-amino propiononitrile, diethyl amino acetonitrile, N,N-bis(2-hydroxy ethyl)amino acetonitrile, N,N-bis(2-acetoxy ethyl)amino acetonitrile, N,N-bis(2-formyl oxy-ethyl) amino acetonitrile, N,N-bis (2-methoxy ethyl)amino acetonitrile, N,N-bis[2-(methoxy methoxy)ethyl]amino acetonitrile, methyl N-cyanomethyl-N-(2-methoxy ethyl)-3-amino propionate, methyl N-cyanomethyl-N-(2-hydroxy ethyl)-3-amino propionate, methyl N-(2-acetoxy ethyl)-N-cyanomethyl-3-amino propionate, N-cyanomethyl-N-(2-hydroxy ethyl)amino acetonitrile, N-(2-acetoxy ethyl)-N-(cyanomethyl)amino acetonitrile, N-cyanomethyl-N-(2-formyloxy-ethyl)amino acetonitrile, N-cyanomethyl-N-(2-methoxy ethyl)amino acetonitrile, N-cyanomethyl-N-[2-(methoxy methoxy)ethyl]amino acetonitrile, N-(cyanomethyl)-N-(3-hydroxy-1-propyl)amino acetonitrile, N-(3-acetoxy-1-propyl)-N-(cyanomethyl)amino acetonitrile, N-cyanomethyl-N-(3-formyloxy-1-propyl)amino acetonitrile, N,N-bis(cyanomethyl)amino acetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethyl amino propionate, cyanomethyl N,N-bis(2-hydroxyethyl)-3-amino propionate, cyanomethyl N,N-bis(2-acetoxy ethyl)-3-amino propionate, cyanomethyl N,N-bis(2-formyloxy-ethyl)-3-amino propionate, cyanomethyl N,N-bis (2-methoxy ethyl)-3-amino propionate, cyanomethyl N,N-bis[2-(methoxy methoxy)ethyl]-3-amino propionate, (2-cyanoethyl) 3-diethyl amino propionate, (2-cyanoethyl) N,N-bis(2-hydroxy ethyl)-3-amino propionate, (2-cyanoethyl) N,N-bis(2-acetoxyethyl)-3-amino propionate, (2-cyanoethyl) N,N-bis(2-formyl oxy-ethyl)-3-amino propionate, (2-cyanoethyl) N,N-bis(2-methoxy ethyl)-3-amino propionate, (2-cyanoethyl) N,N-bis[2-(methoxy methoxy)ethyl]-3-amino propionate, cyanomethyl 1-pyrrolidine propionate, cyanomethyl 1-piperidine propionate, cyanomethyl 4-morpholine propionate, (2-cyanoethyl) 1-pyrrolidine propionate, (2-cyanoethyl) 1-piperidine propionate, (2-cyanoethyl) 4-morpholine propionate, and the like.

The amount of addition of the basic compound in the present invention is preferably 0.001 to 2 parts, and in particular, more preferably 0.01 to 1 part to 100 parts of the base resin. When the amount is 0.001 parts or more, sufficient effects of adding the compound are obtained. When the amount is 2 parts or less, there is little possibility that sensitivity may be deteriorated.

As mentioned above, a surfactant may be further added to the negative resist composition according to the present invention. Addition of a surfactant makes it possible to enhance further or control application properties of the resist composition.

Examples of such a surfactant may include: nonionic surfactants such as polyoxyethylene alkyl ethers such as polyoxyethylene lauryl ether, polyethylene stearyl ether, polyoxyethylene cetyl ether, or polyoxyethylene olein ether; polyoxyethylene alkyl aryl ethers such as polyoxyethylene octyl-phenol ether, or polyoxyethylene nonyl phenol; polyoxyethylene polyoxy propylene block copolymers; sorbitan fatty acid esters such as sorbitan monolaurate, sorbitan monopalmitate, or sorbitan monostearate; polyoxyethylene sorbitan fatty acid esters such as polyoxyethylene sorbitan monolaurate, polyoxyethylene sorbitan monopalmitate, polyoxyethylene sorbitan monostearate, polyoxyethylene sorbitan trioleate, polyoxyethylene sorbitan tristearate; fluorinated surfactants such as EFTOP EF301, EF303 or EF352 (manufactured by Tohchem), MEGAFACE F171, F172, or F173 (manufactured by Dainippon Ink Industry), Fluorad FC430, FC431, or FC-4430 (manufactured by Sumitomo 3M), Asahiguard AG710, Surflon S-381, S-382, SC101, SC102, SC103, SC104, SC105 and SC106, Surfynol E1004, KH-10, KH-20, KH-30 or KH-40 (manufactured by Asahi Glass Co., Ltd.); organo siloxane polymer KP-341, X-70-092, or X-70-093 (manufactured by Shin-Etsu Chemical Co., Ltd.), acrylate or methacrylate based POLYFLOW No. 75 or No. 95 (manufactured by KYOEISHA CHEMICAL), or the like. Among the surfactants, FC430, FC-4430, Surflon S-381, Surfynol E1004, KH-20 and KH-30 are preferably used. Above surfactants may be used alone or in admixture.

The amount of the surfactant to be added to the negative resist composition, in particular to the chemically amplified negative resist composition, according to the present invention is 2 parts or less, preferably 1 part or less to 100 parts of a base resin in the resist composition.

In the case of using the negative resist composition according to the present invention, for example, a chemically amplified negative resist composition containing an organic solvent, the polymer represented by the general formula (1), an acid generator and a basic compound, for manufacturing various integrated circuits, lithography techniques known in the art may be used. However, the manufacturing is not limited thereto.

That is, patterns are formed on semiconductor substrates, mask substrates, or the like by a patterning process comprising: at least, a step of applying the negative resist composition according to the present invention to a substrate; a step of conducting a heat-treatment and then exposing the substrate to a high energy beam; and a step of developing the substrate with a developer.

For example, the negative resist composition according to the present invention is applied to a substrate for fabricating integrated circuits such as Si, $SiO_2$, SiN, SiON, TiN, WSi, BPSG, SOG, or an organic antireflection coating; or a substrate for fabricating mask circuits such as Cr, CrO, CrON, or MoSi by an appropriate coating method such as spin coating, roll coating, flow coating, dip coating, spray coating, or doctor coating so that the thickness of the coated film is 0.1 to 2.0 μm. The coated film is prebaked on a hot plate at 60 to 150° C. for 10 seconds to 30 minutes, preferably at 80 to 120° C. for 30 seconds to 20 minutes.

Subsequently, a target pattern is exposed through a predetermined mask or directly with a light source selected from high energy beams such as ultraviolet ray, far ultraviolet ray, electron beam, X-ray, excimer lasers, γ ray, or synchrotron-radiation. The exposure is preferably conducted so that an exposure dose be about 1 to 200 $mJ/cm^2$, preferably about 10 to 100 $mJ/cm^2$, or 0.1 to 100 μC, preferably about 0.5 to 50 μC. Next, post exposure baking (PEB) is conducted on a hot plate at 60 to 150° C. for 10 seconds to 30 minutes, preferably at 80 to 120° C. for 30 seconds to 20 minutes.

Next, the substrate is developed with a developer of an aqueous alkali solution such as 0.1 to 5 mass %, preferably 2 to 3 mass % tetramethylammonium hydroxide (TMAH) for 3 seconds to 3 minutes, preferably for 5 seconds to 2 minutes according to a standard procedure such as a dip method, a puddle method, or a spray method. As a result, areas exposed to light turns insoluble in the developer, whereas non-exposed areas do dissolve in the developer, whereby a target negative pattern is formed on the substrate.

It should be noted that the resist composition according to the present invention is particularly suitable for micropatterning with an electron beam, soft X ray, X-ray, γ ray, or synchrotron-radiation among high-energy beams.

EXAMPLES

Hereinafter, the present invention will be explained further in detail with reference to Synthetic Examples, Comparative Synthetic Examples, Examples, and Comparative Examples. However, the present invention is not limited by the following Examples and so on. It should be noted that GPC denotes gel permeation chromatography hereafter.

Synthetic Example 1

To a 2 L flask were added 212 g of 6-acetoxy-2-vinylnaphthalene and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Polymerization Ratio (Mole Ratio)

6-hydroxy-2-vinylnaphthalene=1.0

Weight-average molecular weight (Mw)=9,300

Molecular-weight distribution (Mw/Mn)=1.78

The polymer is defined as polymer 1.

polymer 1

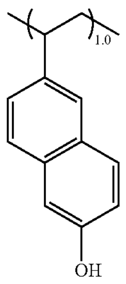

Synthetic Example 2

To a 2 L flask were added 106 g of 6-acetoxy-2-vinylnaphthalene, 81 g of 4-acetoxy styrene, and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Copolymerization Ratio (Mole Ratio)

6-hydroxy-2-vinylnaphthalene: 4-hydroxy styrene=0.5:0.5

Weight-average molecular weight (Mw)=10,500

Molecular-weight distribution (Mw/Mn)=1.79

The polymer is defined as polymer 2.

polymer 2

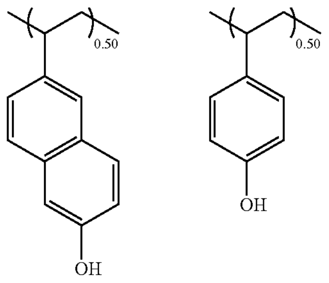

Synthetic Example 3

To a 2 L flask were added 84.8 g of 6-acetoxy-2-vinylnaphthalene, 81 g of 4-acetoxy styrene, 14.0 g of indene and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}$C, $^{1}$H-NMR and GPC measurement, and the following results were obtained.

Copolymerization Ratio (Mole Ratio)

6-hydroxy-2-vinylnaphthalene:4-hydroxy styrene: indene=0.4:0.5:0.1

Weight-average molecular weight (Mw)=8,600

Molecular-weight distribution (Mw/Mn)=1.82

The polymer is defined as polymer 3.

polymer 3

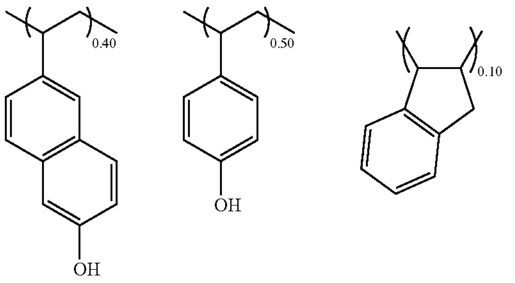

Synthetic Example 4

To a 2 L flask were added 84.8 g of 6-acetoxy-2-vinylnaphthalene, 81 g of 4-acetoxy styrene, 27.3 g of acenaphthylene and 250 g of toluene as a solvent. This reaction vessel was cooled to −70° C. under nitrogen atmosphere, and then degassing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}$C, $^{1}$H-NMR and GPC measurement, and the following results were obtained.

Copolymerization Ratio (Mole Ratio)

6-hydroxy-2-vinylnaphthalene:4-hydroxy styrene: acenaphthylene=0.4:0.5:0.1

Weight-average molecular weight (Mw)=6,100

Molecular-weight distribution (Mw/Mn)=1.76

The polymer is defined as polymer 4.

polymer 4

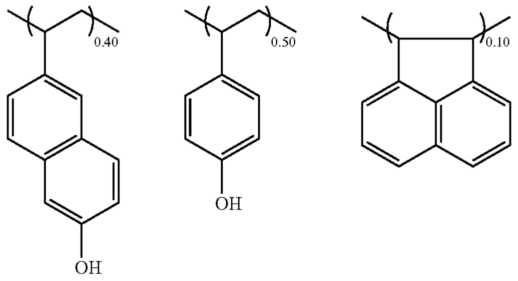

Synthetic Example 5

To a 2 L flask were added 64.8 g of 4-acetoxy styrene, 89.1 g of 6-acetoxy-2-vinylnaphthalene, 24.2 g of oxyphenyldiphenyl sulfonium 4-acrylate bis(perfluorobutyl sulfonyl) imide and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}$C, $^{1}$H-NMR and GPC measurement, and the following results were obtained.

Copolymerization Ratio (Mole Ratio)

4-hydroxy styrene:6-hydroxy-2-vinylnaphthalene: oxyphenyldiphenyl sulfonium 4-acrylate bis(perfluorobutyl sulfonyl)imide=0.40:0.55:0.05

Weight-average molecular weight (Mw)=8,800

Molecular-weight distribution (Mw/Mn)=1.76

The polymer is defined as polymer 5.

polymer 5

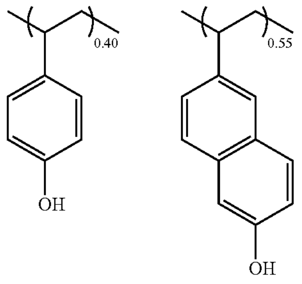

-continued

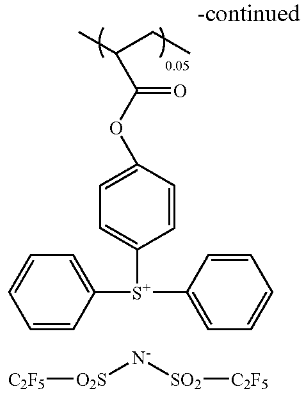

Synthetic Example 6

To a 2 L flask were added 190.8 g of 6-acetoxy-2-vinylnaphthalene, 10.2 g of α-hydroxymethyl acrylic acid and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Copolymerization Ratio (Mole Ratio)

6-hydroxy-2-vinylnaphthalene:α-hydroxymethyl acrylic acid=0.9:0.1

Weight-average molecular weight (Mw)=9,100

Molecular-weight distribution (Mw/Mn)=1.74

The polymer is defined as polymer 6.

polymer 6

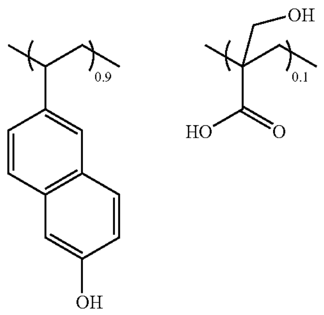

Synthetic Example 7

To a 2 L flask were added 190.8 g of 6-acetoxy-2-vinylnaphthalene, 27.0 g of 4-(1,1,1,3,3,3-hexafluoro-2-hydroxypropyl)styrene and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Copolymerization Ratio (Mole Ratio)

6-hydroxy-2-vinylnaphthalene:4-(1,1,1,3,3,3-hexafluoro-2-hydroxypropyl) styrene=0.9:0.1

Weight-average molecular weight (Mw)=9,600

Molecular-weight distribution (Mw/Mn)=1.79

The polymer is defined as polymer 7.

polymer 7

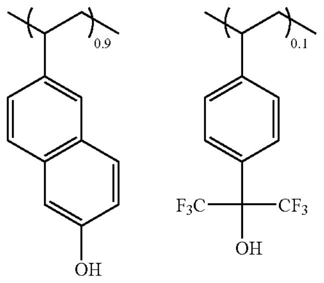

Synthetic Example 8

To a 2 L flask were added 190.8 g of 6-acetoxy-2-vinylnaphthalene, 29.0 g of 4,4-difluoro-5-hydroxy-3-methyl-5-trifluoromethylfuran-3-yl methacrylate, and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Copolymerization Ratio (Mole Ratio)

6-hydroxy-2-vinylnaphthalene:4,4-difluoro-5-hydroxy-3-methyl-5-trifluoromethylfuran-3-yl methacrylate=0.9:0.1

Weight-average molecular weight (Mw)=8,900

Molecular-weight distribution (Mw/Mn)=1.79

The polymer is defined as polymer 8.

polymer 8

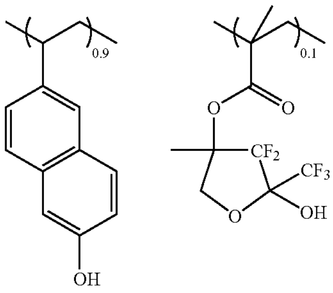

Synthetic Example 9

To a 2 L flask were added 106.0 g of 6-acetoxy-2-vinylnaphthalene, 27.0 g of 4-(1,1,1,3,3,3-hexafluoro-2-hydroxypropyl)styrene, 64.0 g of acetoxy styrene, and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Copolymerization Ratio (Mole Ratio)

6-hydroxy-2-vinylnaphthalene:4-(1,1,1,3,3,3-hexafluoro-2-hydroxypropyl) styrene:4-hydroxy styrene=0.5:0.1:0.4

Weight-average molecular weight (Mw)=9,300

Molecular-weight distribution (Mw/Mn)=1.86

The polymer is defined as polymer 9.

polymer 9

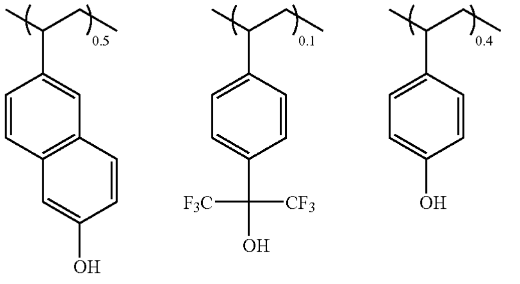

Synthetic Example 10

To a 2 L flask were added 190.8 g of 6-acetoxy-2-vinylnaphthalene, 43.6 g of 3,5-di(1,1,1,3,3,3-hexafluoro-2-hydroxypropyl)styrene, and 250 g of toluene as a solvent. This reaction vessel was cooled to −70° C. under nitrogen atmosphere, and then degasing under reduced pressure and nitrogen blowing were repeated 3 times. After the temperature was elevated to room temperature, 8.2 g of AIBN (azobisisobutyronitrile) was added as a polymerization initiator, then the temperature was elevated to 60° C. and a reaction was conducted for 15 hours. This reaction solution was precipitated in a 5 L solution of isopropyl alcohol. Thus obtained white solid was dissolved in 500 mL of methanol and 800 mL of tetrahydrofuran. Then 50 g of triethylamine and 50 g of water were added thereto and a deprotection reaction of acetyl groups was conducted at 70° C. for 5 hours. The reaction was quenched with acetic acid. The reaction solution was concentrated, and then dissolved in 500 mL of acetone. The precipitation as with above, filtration, and drying at 60° C. were conducted to obtain a white polymer.

The obtained polymer was analyzed by $^{13}C$, $^{1}H$-NMR and GPC measurement, and the following results were obtained.

Copolymerization Ratio (Mole Ratio)

6-hydroxy-2-vinylnaphthalene:3,5-di(1,1,1,3,3,3-hexafluoro-2-hydroxypropyl)styrene=0.9:0.1

Weight-average molecular weight (Mw)=6,800

Molecular-weight distribution (Mw/Mn)=1.49

The polymer is defined as polymer 10.

polymer 10

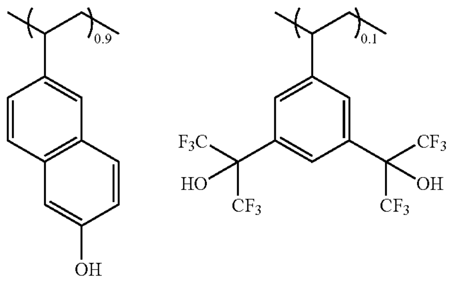

Comparative Synthetic Example 1

According to a method as with above Synthetic Examples, the following two component polymer was synthesized.

The obtained polymer was analyzed by $^{13}C$, $^{1}H$-NMR and GPC measurement, and the following results were obtained.

Copolymerization Ratio (Mole Ratio)

hydroxy styrene:styrene=0.7:0.3

Weight-average molecular weight (Mw)=4,500

Molecular-weight distribution (Mw/Mn)=1.55

The polymer is defined as comparative polymer 1.

comparative polymer 1

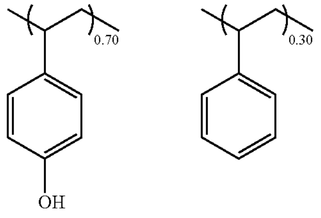

Comparative Synthetic Example 2

According to a method as with above Synthetic Examples, the following two component polymer was synthesized.

The obtained polymer was analyzed by $^{13}C$, $^{1}H$-NMR and GPC measurement, and the following results were obtained.

Copolymerization Ratio (Mole Ratio)

hydroxy styrene: 1-vinylnaphthalene=0.8:0.2

Weight-average molecular weight (Mw)=5,900

Molecular-weight distribution (Mw/Mn)=1.51

The polymer is defined as comparative polymer 2.

comparative polymer 2

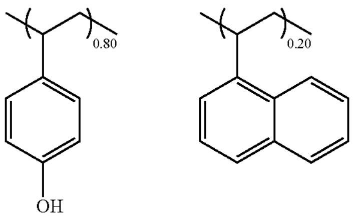

EXAMPLES, COMPARATIVE EXAMPLES

[Preparation of Negative Resist Composition]

The polymers synthesized above (polymers 1 to 10 and comparative polymers 1 and 2), acid generators (PAG1 and PAG2), basic compounds (Amine1, Amine-2, and Amine-3), a dissolution inhibitor (DRR1), and a crosslinker (Crosslinker1) represented by the following formulae were dissolved into organic solvents in compositions shown in Table 1 to prepare resist compositions. Then the compositions were filtered through 0.2 μm filters to prepare solutions of resist compositions, respectively.

Each component in Table 1 is as follows.

polymers 1 to 10: obtained in Synthetic Examples 1 to 10 comparative polymers 1 and 2: obtained in Comparative Synthetic Examples 1 and 2

Acid Generators: PAG1 and PAG2 (refer to the following structural formulae)

PAG1

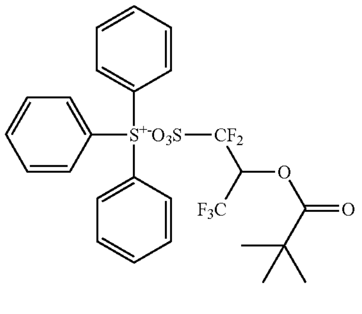

-continued

PAG2

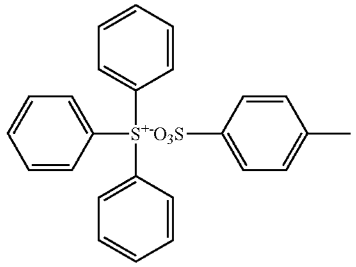

Basic Compounds: Amine1, Amine-2, and Amine-3 (refer to the following structural formulae)

Amine 1

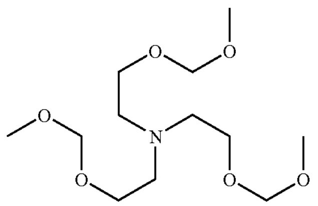

Amine 2

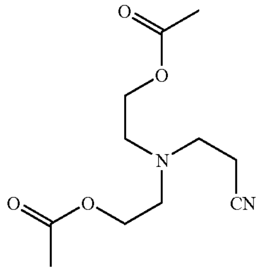

Amine 3

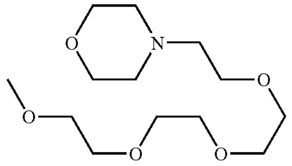

Dissolution Inhibitor: DRR1 (refer to the following structural formula)

DRR 1

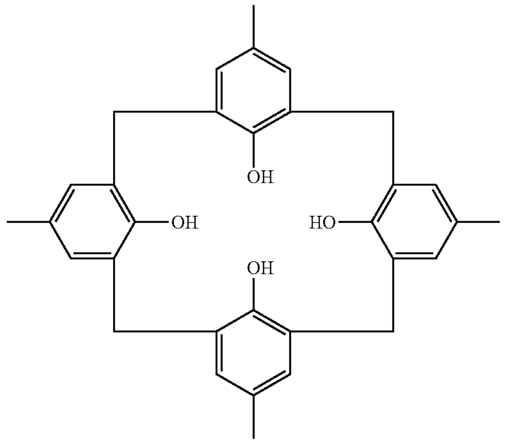

Crosslinker: Crosslinker1 (refer to the following structural formula)

Crosslinker 1

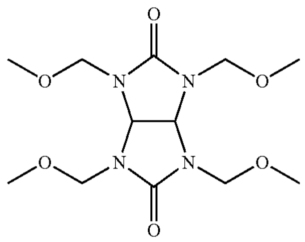

Organic Solvent: PGMEA (propylene glycol methyl ether acetate)

TABLE 1

| | Polymer (Parts by mass) | Acid Generator (Parts by mass) | Basic Compound (Parts by mass) | Dissolution Inhibitor (Parts by mass) | Crosslinker (Parts by mass) | Organic Solvent (Parts by mass) | Sensitivity ($\mu C/cm^2$) | Resolution | Edge Roughness (nm) |
|---|---|---|---|---|---|---|---|---|---|
| Example 1 | Polymer 1 (100) | PAG 1 (5) | Amine1 (0.2) | DRR1 (10) | Crosslinker1 (10) | PGMEA (1000) | 7.5 | 80 nm | 8.1 |
| Example 2 | Polymer 2 (100) | PAG 1 (5) | Amine1 (0.2) | — | Crosslinker1 (10) | PGMEA (1000) | 6.2 | 80 nm | 8.0 |
| Example 3 | Polymer 3 (100) | PAG 1 (5) | Amine1 (0.2) | — | Crosslinker1 (10) | PGMEA (1000) | 7.2 | 80 nm | 8.2 |
| Example 4 | Polymer 4 (100) | PAG 1 (5) | Amine1 (0.2) | — | Crosslinker1 (10) | PGMEA (1000) | 6.9 | 80 nm | 7.5 |
| Example 5 | Polymer 5 (100) | — | Amine1 (0.2) | — | Crosslinker1 (10) | PGMEA (1000) | 7.7 | 80 nm | 7.9 |
| Example 6 | Polymer 6 (100) | PAG 1 (5) | Amine1 (0.2) | — | Crosslinker1 (10) | PGMEA (1000) | 7.3 | 80 nm | 8.3 |
| Example 7 | Polymer 7 (100) | PAG 1 (5) | Amine1 (0.2) | — | Crosslinker1 (10) | PGMEA (1000) | 7.0 | 80 nm | 7.2 |
| Example 8 | Polymer 8 (100) | PAG 1 (5) | Amine1 (0.2) | — | Crosslinker1 (10) | PGMEA (1000) | 6.8 | 80 nm | 7.0 |
| Example 9 | Polymer 2 (100) | PAG 2 (5) | Amine1 (0.2) | — | Crosslinker1 (10) | PGMEA (1000) | 8.0 | 80 nm | 8.3 |
| Example 10 | Polymer 2 (100) | PAG 1 (5) | Amine2 (0.2) | — | Crosslinker1 (10) | PGMEA (1000) | 6.3 | 80 nm | 8.5 |
| Example 11 | Polymer 2 (100) | PAG 1 (5) | Amine3 (0.2) | — | Crosslinker1 (10) | PGMEA (1000) | 6.8 | 80 nm | 8.1 |
| Example 12 | Polymer 9 (100) | PAG 1 (5) | Amine1 (0.2) | — | Crosslinker1 (10) | PGMEA (1000) | 6.2 | 80 nm | 7.5 |
| Example 13 | Polymer 10 (100) | PAG 1 (5) | Amine1 (0.2) | — | Crosslinker1 (10) | PGMEA (1000) | 7.9 | 80 nm | 7.8 |
| Comparative Example 1 | Comparative Polymer 1 (100) | PAG 1 (5) | Amine1 (0.2) | — | Crosslinker1 (10) | PGMEA (1000) | 8.5 | 100 nm | 12.5 |
| Comparative Example 2 | Comparative Polymer 2 (100) | PAG 1 (5) | Amine1 (0.2) | — | Crosslinker1 (10) | PGMEA (1000) | 9.0 | 100 nm | 13.5 |

[Evaluation of Electron Beam Lithography]

Each of the above-prepared negative resist compositions (Examples 1 to 13 and Comparative Examples 1 and 2) was spin-coated on a silicon substrate 6 inches (200 mm) across with Clean Track Mark 5 (Manufactured by Tokyo Electron Limited), and was prebaked at 110° C. for 90 seconds on a hot plate to prepare a 100 nm thick resist film. Lithography was performed on the resist film in a vacuum chamber with HL-800D manufactured by Hitachi Ltd. at 50 keV of HV voltage.

Post exposure bake (PEB) was performed immediately after the lithography with Clean Track Mark 5 (Manufactured by Tokyo Electron Limited) at 110° C. for 90 seconds on a hot plate. Then puddle development was performed for 30 seconds in 2.38 mass % aqueous solution of TMAH, to give a negative pattern.

The obtained resist pattern was evaluated as follows.

An exposure dose that resolved 0.12 μm line and space in 1:1 was determined as sensitivity of a resist. Edge roughness of 120 nm LS was measured with SEM.

Compositions of the resists, and results of sensitivity and resolution in EB exposure are shown in Table 1.

From the results in Table 1, it has been established that the resist compositions of Examples 1 to 13 exhibit higher sensitivity, higher resolution and smaller edge roughness after exposure than the hydroxy styrene resist compositions of Comparative Examples 1 and 2.

[Evaluation of Dry Etching Resistance]

In dry etching resistance tests, 2 g of the each polymers synthesized above (polymers 1 to 10, and comparative polymers 1 and 2) was dissolved in 10 g of PGMEA and filtered through a 0.2 μm filter to give a polymer solution. The polymer solution was spin coated onto a silicon substrate to form a 300 nm thick film. Then, etch resistance was evaluated under the following conditions.

Etching Test with $CHF_3/CF_4$ Gas

A difference of a film thickness of each polymer film before and after etching was measured with dry-etching-system TE-8500P manufactured by Tokyo Electron, Ltd.

In this evaluation, a film that has a small film thickness difference, that is, a film that exhibits a small etching rate has excellent etching resistance.

Etching conditions are shown below.

Chamber pressure: 40.0 Pa
RF power: 1,000 W
Gap: 9 mm
$CHF_3$ gas flow rate: 30 ml/min
$CF_4$ gas flow rate: 30 ml/min
Ar gas flow rate: 100 ml/min
Time: 60 sec Results are shown in Table 2.

TABLE 2

| Polymer | $CHF_3/CF_4$ Gas Etching Rate (nm/min) |
|---|---|
| polymer 1 | 92 |
| polymer 2 | 100 |
| polymer 3 | 95 |
| polymer 4 | 92 |
| polymer 5 | 105 |
| polymer 6 | 112 |
| polymer 7 | 111 |
| polymer 8 | 116 |
| polymer 9 | 116 |
| polymer 10 | 111 |
| comparative polymer 1 | 122 |
| comparative polymer 2 | 119 |

From the results of Table 2, it has been established that polymers according to the present invention (polymers 1 to 10) have higher dry etching resistance than comparative polymers 1 and 2.

The present invention is not limited to the above-described embodiments. The above-described embodiments are mere examples, and those having the substantially same structure as that described in the appended claims and providing the similar action and advantages are included in the scope of the present invention.

The invention claimed is:

1. A negative resist composition comprising, at least, a polymer comprising a repeating unit of hydroxy vinylnaphthalene represented by the following general formula (1) and a repeating unit represented by the following general formula (1)-2, (1)

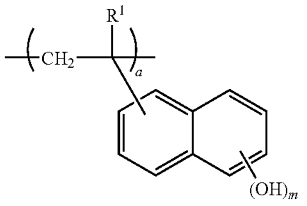

(1)-2

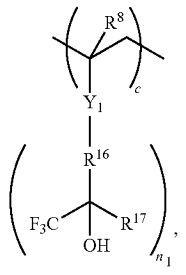

wherein $R^1$ represents a hydrogen atom or a methyl group, m represents 1 or 2, a satisfies 0<a<1, $R^8$ represents a hydrogen atom, a fluorine atom, a methyl group, or a trifluoromethyl group, $Y_1$ represents a single bond, a benzene ring, —O—, —C(═O)—O—, or —C(═O)—O —$R^{18}$—C(═O)—O—, $R^{18}$ represents a linear, branched or cyclic alkylene group having 1-10 carbon atoms that may optionally have an alkylene group substituted with a fluorine atom or a trifluoromethyl group, $R^{16}$ represents a single bond, or a linear, branched or cyclic alkylene group having 1-10 carbon atoms that may optionally be substituted with a fluorine atom and that may optionally have a hydroxyl group, $R^{17}$ represents a hydrogen atom, a fluorine atom, a methyl group, a trifluoromethyl group, or a difluoromethyl group; $R^{17}$ may be linked to $R^{16}$ to form a ring, and the ring may have one or more of an ether group, an alkylene group substituted with a fluorine atom and a trifluoromethyl group, $n_1$ represents 1 or 2, and c satisfies 0<c<1.

2. The negative resist composition according to claim 1, wherein the polymer further comprises a repeating unit represented by the following general formula (1)-1, (1)-1

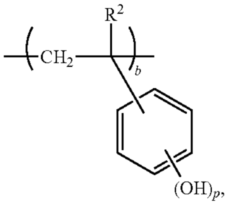

wherein $R^2$ represents a hydrogen atom or a methyl group;

p represents 1 or 2; and b satisfies 0<b<1.

3. The negative resist composition according to claim 2, wherein the polymer further comprises a repeating unit represented by the following general formula (1)-3, (1)-3

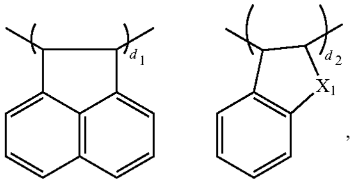

, wherein $X_1$ represents any one of a methylene group, an oxygen atom, and a sulfur atom; and $d_1$ and $d_2$ satisfy $0 \leqq d_1 < 1$, $0 \leqq d_2 < 1$, and $0 < d_1 + d_2 < 1$.

4. The negative resist composition according to claim 3, wherein the polymer has a weight average molecular weight in the range of 1,000 to 500,000.

5. The negative resist composition according to claim 2, wherein the polymer has a weight average molecular weight in the range of 1,000 to 500,000.

6. The negative resist composition according to claim 2, which is a chemically amplified resist composition containing an acid generator.

7. The negative resist composition according to claim 6, containing any one or more of an organic solvent, a basic compound, a dissolution inhibitor, a surfactant and a crosslinker.

8. The negative resist composition according to claim 1, wherein the polymer further comprises a repeating unit represented by the following general formula (1)-3, (1)-3

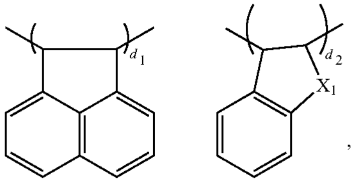

, wherein $X_1$ represents any one of a methylene group, an oxygen atom, and a sulfur atom; and $d_1$ and $d_2$ satisfy $0 \leqq d_1 \leqq 1, 0 \leqq d_2 < 1$, and $0 < d_1 + d_2 < 1$.

9. The negative resist composition according to claim 8, wherein the polymer has a weight average molecular weight in the range of 1,000 to 500,000.

10. The negative resist composition according to claim 1, wherein the polymer has a weight average molecular weight in the range of 1,000 to 500,000.

11. The negative resist composition according to claim 1, which is a chemically amplified resist composition containing an acid generator.

12. The negative resist composition according to claim 1, containing any one or more of an organic solvent, a basic compound, a dissolution inhibitor, a surfactant and a crosslinker.

13. A patterning process comprising: at least, a step of applying the negative resist composition according to claim 1 to a substrate; a step of conducting a heat-treatment and then exposing the substrate to a high energy beam; and a step of developing the substrate with a developer.

* * * * *